(12) United States Patent
Woo

(10) Patent No.: US 10,912,213 B2
(45) Date of Patent: Feb. 2, 2021

(54) FOLDABLE DISPLAY DEVICE MAINTAINING A FOLDING ANGLE BY MAGNETIC FORCE

(71) Applicant: LG Display Co., Ltd., Seoul (KR)

(72) Inventor: SangMin Woo, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/148,210

(22) Filed: Oct. 1, 2018

(65) Prior Publication Data
US 2019/0200470 A1   Jun. 27, 2019

(30) Foreign Application Priority Data

Dec. 27, 2017  (KR) .................. 10-2017-0180930
Dec. 27, 2017  (KR) .................. 10-2017-0181107

(51) Int. Cl.
*H05K 5/02*  (2006.01)
*H05K 5/03*  (2006.01)
(Continued)

(52) U.S. Cl.
CPC ............. *H05K 5/0226* (2013.01); *E05D 3/06* (2013.01); *E05D 11/087* (2013.01); *E05D 11/10* (2013.01);
(Continued)

(58) Field of Classification Search
CPC ...... H05K 5/03; H05K 5/0017; H05K 5/0226; E05D 11/087; E05D 11/10;
(Continued)

(56) References Cited

U.S. PATENT DOCUMENTS 9,348,450 B1    5/2016  Kim
10,268,244 B2 *  4/2019  Lin ................. H04M 1/0216
(Continued)

FOREIGN PATENT DOCUMENTS

CN    1630312 A    6/2005
CN    1809088 A    7/2006
(Continued)

OTHER PUBLICATIONS

Extended European Search Report dated May 24, 2019, issued in corresponding European Patent Application No. 18212538.5.
(Continued)

*Primary Examiner* — Rockshana D Chowdhury
*Assistant Examiner* — Douglas R Burtner
(74) *Attorney, Agent, or Firm* — Morgan, Lewis & Bockius LLP

(57) ABSTRACT

The present disclosure relates to a foldable display device. A foldable display device includes a display panel on a first cover and a second cover and at least one hinge that connects the first cover and the second cover and the hinge includes a fixing frame, a pair of hinge shafts that passes through the fixing frame, a pair of rotating plates that is fixed to one end of the pair of hinge shafts and fixed to the first cover and the second cover to rotate together with the first cover and the second cover, and a pair of first holding members that is coupled to the pair of hinge shafts between the fixing frame and the pair of rotating plates and controls a folding angle of the first cover and the second cover by a magnetic force, thereby permanently implementing a holding force.

6 Claims, 18 Drawing Sheets

(51) Int. Cl.
  *H05K 5/00* (2006.01)
  *E05D 3/06* (2006.01)
  *E05D 11/08* (2006.01)
  *E05D 11/10* (2006.01)
  *G06F 1/16* (2006.01)

(52) U.S. Cl.
  CPC ........ *G06F 1/1616* (2013.01); *G06F 1/1679* (2013.01); *G06F 1/1681* (2013.01); *H05K 5/0017* (2013.01); *H05K 5/03* (2013.01); *E05Y 2201/218* (2013.01); *E05Y 2201/46* (2013.01); *E05Y 2201/474* (2013.01); *E05Y 2900/606* (2013.01)

(58) Field of Classification Search
  CPC ........ E05Y 2201/218; E05Y 2201/46; E05Y 2201/474; E05Y 2900/606
  See application file for complete search history.

(56) References Cited

U.S. PATENT DOCUMENTS

| | | | |
|---|---|---|---|
| 10,602,623 B1* | 3/2020 | Myers | G06F 3/147 |
| 2005/0122311 A1 | 6/2005 | Lee et al. | |
| 2006/0160582 A1 | 7/2006 | Jeun et al. | |
| 2009/0167472 A1* | 7/2009 | Lu | H04M 1/0216 335/287 |
| 2011/0159934 A1 | 6/2011 | Yu et al. | |
| 2013/0097805 A1* | 4/2013 | Bland | E05F 1/00 16/72 |
| 2013/0176668 A1 | 7/2013 | Okutsu | |
| 2013/0329360 A1 | 12/2013 | Aldana | |
| 2014/0268555 A1* | 9/2014 | Kurczewski | G06F 1/1679 361/679.55 |
| 2014/0293525 A1* | 10/2014 | Tomita | G06F 1/1679 361/679.06 |
| 2014/0360296 A1* | 12/2014 | Hsu | G06F 1/1618 74/98 |
| 2015/0009614 A1* | 1/2015 | Tsai | G06F 1/1616 361/679.27 |
| 2015/0378397 A1 | 12/2015 | Park et al. | |
| 2016/0378145 A1* | 12/2016 | Sung | G06F 1/1632 361/679.55 |
| 2017/0220077 A1* | 8/2017 | Holung | G06F 1/1681 |
| 2018/0052497 A1* | 2/2018 | Maatta | G06F 1/1616 |
| 2018/0210513 A1* | 7/2018 | Lin | H04B 1/3888 |
| 2018/0258965 A1* | 9/2018 | Danko | A63H 33/046 |
| 2018/0291663 A1* | 10/2018 | Wu | E05F 1/1223 |
| 2018/0356864 A1* | 12/2018 | Lee | G06F 1/1681 |
| 2019/0025889 A1* | 1/2019 | Szeto | G06F 3/04886 |
| 2019/0029135 A1* | 1/2019 | Park | H04M 1/022 |
| 2019/0166703 A1* | 5/2019 | Kim | G06F 1/1681 |
| 2020/0100372 A1* | 3/2020 | Hirakata | G06F 1/1616 |
| 2020/0166973 A1* | 5/2020 | Kang | G06F 1/1669 |
| 2020/0183462 A1* | 6/2020 | Li | F16C 11/04 |
| 2020/0278723 A1* | 9/2020 | Chen | E05D 3/02 |

FOREIGN PATENT DOCUMENTS

| | | |
|---|---|---|
| CN | 104514801 A | 4/2015 |
| CN | 106205385 A | 12/2016 |
| CN | 206102130 U | 4/2017 |
| EP | 3396929 A | 10/2018 |
| JP | 4196115 B2 | 12/2008 |
| JP | 2014-185720 A | 10/2014 |
| JP | 2014185720 A1 * | 10/2014 |
| KR | 10-2017-0069115 A | 6/2017 |

OTHER PUBLICATIONS

Office Action dated Nov. 24, 2020, issued in corresponding Chinese Patent Application No. 201811554320.6.

* cited by examiner

FOLDABLE DISPLAY DEVICE MAINTAINING A FOLDING ANGLE BY MAGNETIC FORCE

CROSS-REFERENCE TO RELATED APPLICATIONS

This application claims the priority of Korean Patent Application No. 10-2017-0181107, filed Dec. 27, 2017 and Korean Patent Application No. 10-2017-0180930 filed Dec. 27, 2017, the disclosures of which are incorporated herein by reference.

BACKGROUND

Technical Field

The present disclosure relates to a foldable display device, and more particularly, to a foldable display device that permanently implements a holding force.

Description of the Related Art

Recently, mobile terminals such as a wireless terminal, a personal digital assistant (PDA), a portable multimedia player (PMP), or an electronic notebook are being small-sized to ensure portability. However, since a user wants to receive various information, such as character information, videos, still images, MP3, or games through a screen of the portable terminal, the user requires a large-sized or a wide-sized screen for the display unit. However, the reduction of the portable terminal results in reduction in the size of the screen of the display unit, so that there are limitations for satisfying both requirements.

To overcome the above-mentioned limitations, recently, a flexible display device such as a bendable display device or a foldable display device is being developed.

The flexible display device may be implemented by configuring a substrate with a plastic material. When the flexible display device is folded, it is simply carried and when the flexible display device is unfolded, a large screen is implemented so that the flexible display device may be applied to various fields including not only mobile equipment such as a mobile phone, an electronic book, or electronic newspaper, but also a television or a monitor.

SUMMARY

The inventors of the present disclosure invented a structure which uses equipment with a hinge in an area where the display panel is folded to implement a foldable display device. That is, in order to maintain a specific folding angle of the foldable display device when the foldable display is folded and unfolded, the inventors of the present disclosure implement a holding force using a frictional force between components which configure the hinge. However, the inventors of the present disclosure recognized that due to the consistent folding and unfolding operation of the foldable display device, the components which configure the hinge are worn out to decrease the holding force for maintaining the specific folding angle of the foldable display device.

Therefore, the inventors of the present disclosure invented a foldable display device with a new structure which permanently implements the holding force without decreasing the holding force even though the foldable display device is consistently used.

Accordingly, embodiments of the present disclosure are directed to a foldable display device that substantially obviates one or more of the problems due to limitations and disadvantages of the related art.

An object of the present disclosure is to provide a foldable display device which implements a holding force for maintaining a folding angle of the foldable display device through a hinge including a holding member using a permanent magnet.

Another object of the present disclosure is to provide a foldable display device which implements a holding force for maintaining a folding angle of the foldable display device by disposing a holding unit which uses a permanent magnet on a slide plate.

Still another object of the present disclosure is to provide a foldable display device which improves durability by permanently implementing the holding force by a magnetic force.

Still another object of the present disclosure is to provide a foldable display device which may reduce a manufacturing cost by means of a simple hinge structure.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a foldable display device comprises a display panel disposed on a first cover and a second cover; and at least one hinge which connects the first cover and the second cover and the hinge includes a fixing frame, a pair of hinge shafts which passes through the fixing frame; a pair of rotating plates which is fixed to one end of the pair of hinge shafts and fixed to the first cover and the second cover to rotate together with the first cover and the second cover; and a pair of first holding members which is coupled to the pair of hinge shafts between the fixing frame and the pair of rotating plates and controls a folding angle of the first cover and the second cover by a magnetic force.

According to another aspect of the present disclosure, a foldable display device comprises a first cover and a second cover coupled to the first cover; a display panel disposed on the first cover and the second cover; a first slide plate which is fixed to one side of the display panel and is disposed in the first cover to slide along a first direction perpendicular to a boundary line of the first cover and the second cover by the folding of the display panel; and a first holding unit which is disposed between the first cover and the first slide plate to control a folding angle of the first cover and the second cover by a magnetic force.

According to still another aspect of the present disclosure, a frame device comprises a first supporting unit and a second supporting unit; a hinge which connects the first supporting unit and the second supporting unit; and a holding unit which includes a plurality of magnetic substances disposed in at least any one of the first supporting unit, the second supporting unit, and the hinge to allow the first supporting unit and the second supporting unit to maintain a specific angle, in which an attractive force and a repulsive force of the plurality of magnetic substances are repeated according to the specific angle formed by the first supporting unit and the second supporting unit.

Therefore, the holding force of the foldable display device may be permanently implemented.

Other detailed matters of the embodiments are included in the detailed description and the drawings.

According to the present disclosure, the holding member of the hinge is configured using a permanent magnet so that the holding force for maintaining a specific folding angle of the foldable display device may be implemented.

According to the present disclosure, the holding unit is configured using a permanent magnet and is applied to the slide plate so that the holding force for maintaining a specific folding angle of the foldable display device may be implemented.

According to the present disclosure, a magnetic force of the permanent magnet is used to implement the permanent holding force so that the durability of the foldable display device may be improved.

According to the present disclosure, a simple hinge structure is implemented by means of a hinge or a holding unit using a permanent magnet, so that the manufacturing cost of the foldable display device may be reduced.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
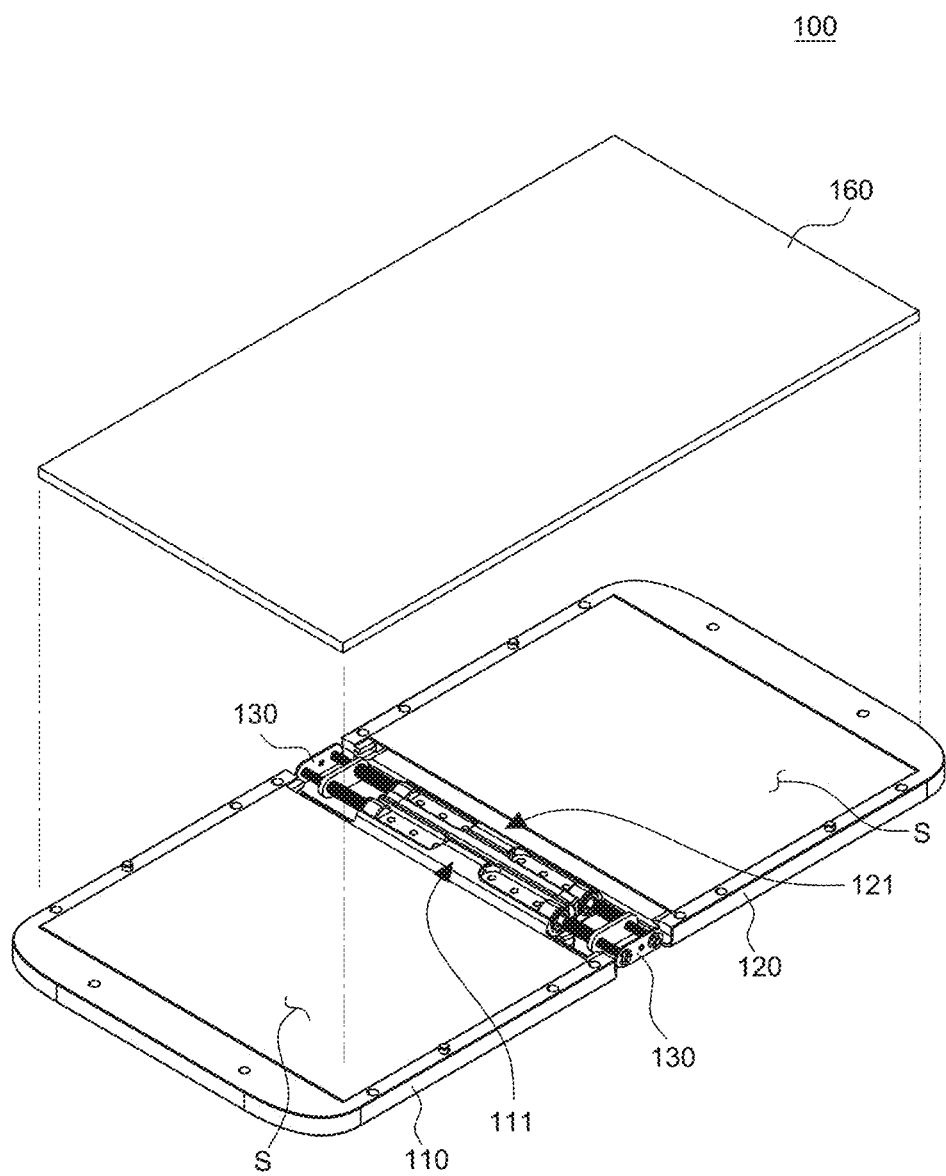
FIG. 1 is a schematic exploded perspective view of a foldable display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it means that another layer or another element may be disposed directly on the other element or a third part may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for the convenience of description, and the present disclosure is not limited to the size and the thickness of the component illustrated.

The features of various embodiments of the present disclosure can be partially or entirely bonded to or combined with each other and can be interlocked and operated in technically various ways understood by those skilled in the art, and the embodiments can be carried out independently of or in association with each other.

Hereinafter, various exemplary embodiments of the present disclosure will be described in detail with reference to accompanying drawings.

Figure 2:
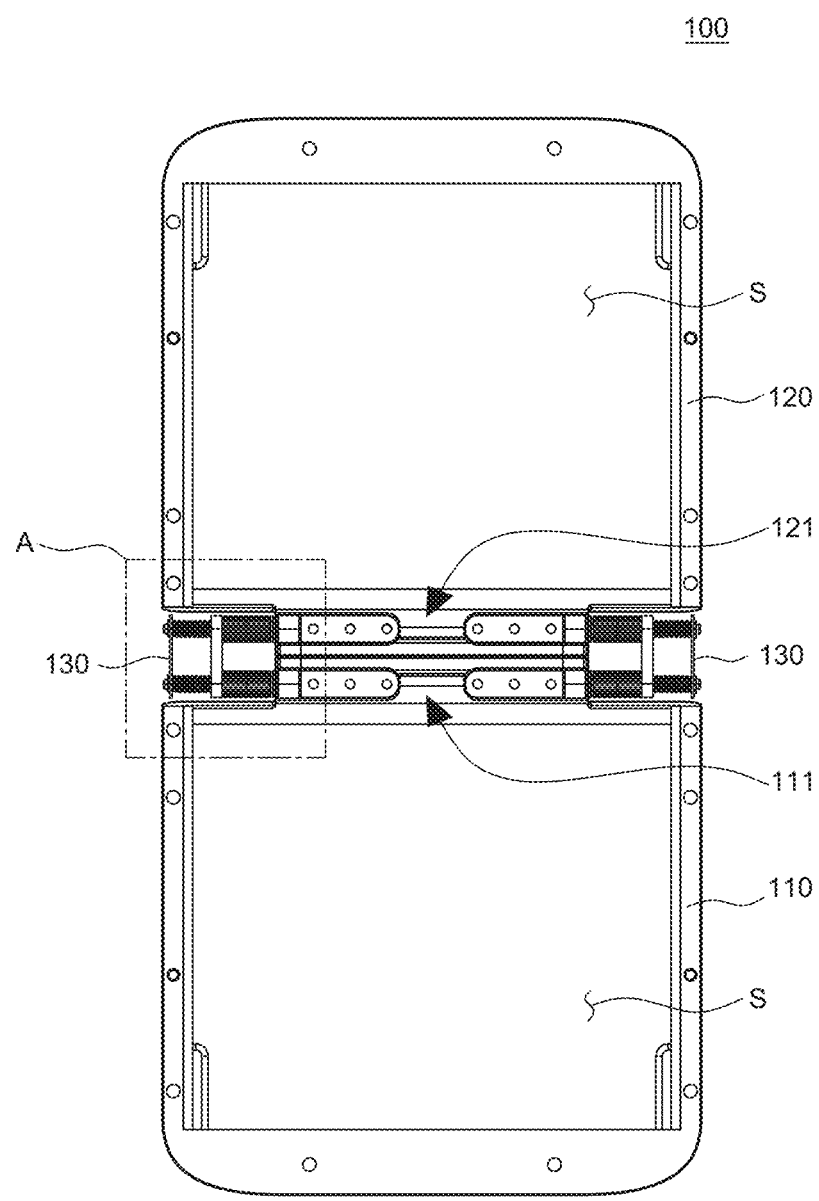
FIG. 2 is a plan view of a foldable display device according to an exemplary embodiment of the present disclosure.

FIG. 1 is a schematic exploded perspective view of a foldable display device according to an exemplary embodiment of the present disclosure. FIG. 2 is a plan view of a foldable display device according to an exemplary embodiment of the present disclosure.

Referring to FIGS. 1 and 2, a foldable display device 100 according to an exemplary embodiment of the present disclosure includes a first cover 110, a second cover 120, a hinge 130, and a display panel 160. In FIG. 1, even though components of the foldable display device 100 are briefly illustrated for the convenience of description, actually, various components for driving the foldable display device 100 may be further included. Further, in FIG. 2, for the convenience of description, the display panel 160 is omitted.

The first cover 110 and the second cover 120 may serve as supporting units. That is, the first cover 110 and the second cover 120 may be base members for supporting the display panel 160 and various components of the foldable display device 100. Further, the first cover 110 and the second cover 120 may include an accommodating unit S which accommodates various components for driving the foldable display device 100.

In the meantime, in the accommodating unit S, components such as a first slide plate 415, a second slide plate 425, a first holding unit 440, and a second holding unit 450 are further disposed, which will be described below in more detail with reference to FIG. 8.

The first cover 110 and the second cover 120 may be disposed in one area and the other area where the foldable display device 100 is folded and unfolded. That is, the foldable display device 100 is folded or unfolded with respect to a boundary area of the first cover 110 and the second cover 120 by an external force which is applied by a user to perform a folding operation. Further, the first cover 110 and the second cover 120 may correspond to one area and the other area of the display panel 160 which will be described below. Therefore, the display panel 160 may also be folded with respect to a boundary line of the first cover 110 and the second cover 120 by folding the foldable display device 100.

The first cover 110 and the second cover 120 include a first fastening unit 111 and a second fastening unit 121 which are coupled to the hinge 130, respectively. The first cover 110 and the second cover 120 may have the same shape and the first fastening unit 111 and the second fastening unit 121 may be symmetrically disposed to face each other.

The hinge 130 connects the first fastening unit 111 of the first cover 110 and the second fastening unit 121 of the second cover 120. In this case, one or more hinges 130 may be provided if necessary. In FIGS. 1 and 2, although hinges are provided one side and the other side of the first fastening unit 111 and the second fastening unit 121, this is just an example for description of the present disclosure and the present disclosure is not limited thereto.

Specifically, a pair of hinges 130 may connect one side and the other side of the first fastening unit 111 and the second fastening unit 121, respectively. The hinge 130 is disposed in a portion where the foldable display device 100 is folded and unfolded to allow the foldable display device 100 to be easily folded and unfolded. Further, the hinge 130 may provide a holding force to maintain a folded state of the foldable display device 100 at a specific angle. In this case, the holding force of the hinge 130 may be provided from the magnetic force by a permanent magnet. A specific structure and function of the hinge 130 will be described below with reference to FIGS. 3 to 6B.

The display panel 160 is disposed on one surfaces of the first cover 110 and the second cover 120. The display panel 160 may use any one of various display panels such as an organic light emitting display panel or a liquid crystal display panel. Further, the display panel 160 may have flexibility so as to be folded and unfolded in accordance with the folding and unfolding of the foldable display device 100.

The foldable display device 100 may be folded so that the first cover 110 and the second cover 120 form a specific folding angle. That is, although in FIGS. 1 and 2, the first cover 110 and the second cover 120 are completely unfolded to at 180 degrees, the foldable display device 100 may be folded at a specific angle. In this case, the display panel 160 disposed on the first cover 110 and the second cover 120 is also folded in accordance with the folding of the first cover 110 and the second cover 120.

That is, the foldable display device 100 may be folded at a specific angle as intended by the user. Further, the foldable display device 100 may be fully folded or unfolded as intended by the user. Moreover, the foldable display device 100 may be in-folded so that the display panel 160 is folded or unfolded to be disposed therein or may be out-folded so that the display panel 160 is folded or unfolded to be disposed outside therefrom. The in-folding and out-folding of the foldable display device 100 will be described below in more detail with respect to FIGS. 13A to 14B.

The foldable display device 100 may maintain a specific folding angle by the holding force provided by the hinge 130. In other words, the first cover 110 and the second cover 120 may be fixed while maintaining a specific folding angle by the hinge 130. Therefore, the foldable display device 100 is folded at a specific angle as intended by the user and maintains a folded state at the specific angle by the holding force of the hinge.

Hereinafter, a specific configuration of the hinge will be described with reference to FIGS. 3 to 6B.

Figure 3:
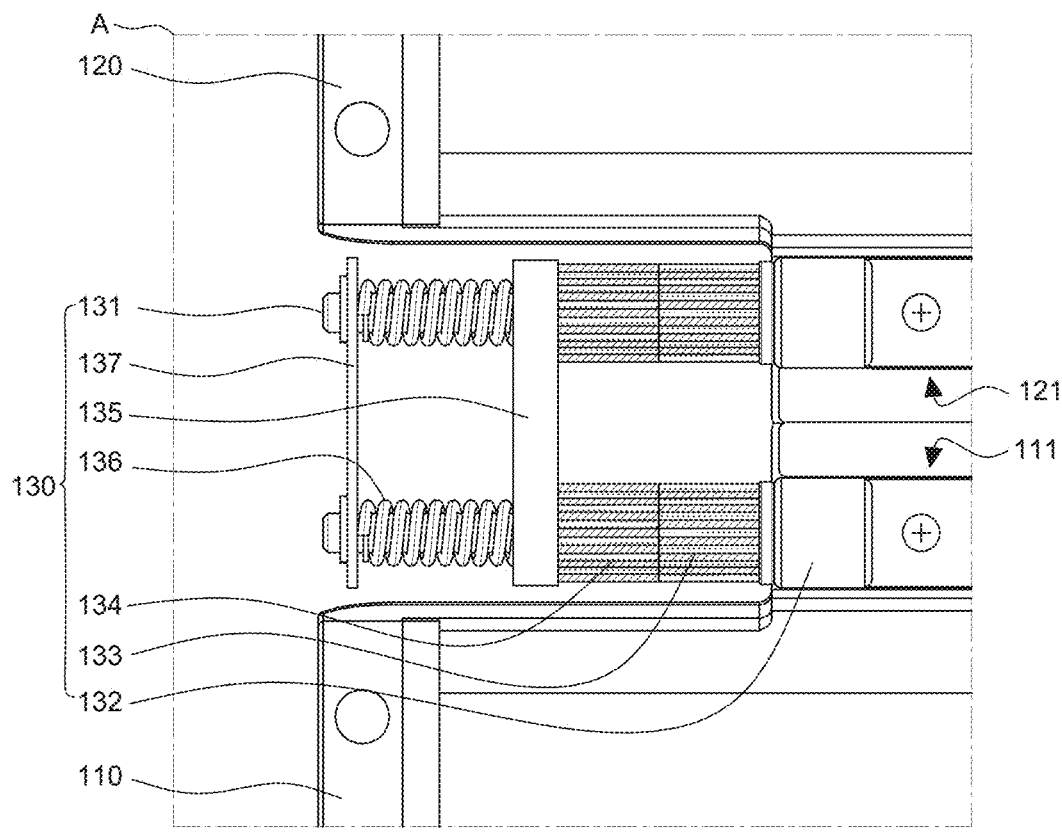
FIG. 3 is an enlarged view of a region A of FIG. 2.
Figure 4A:
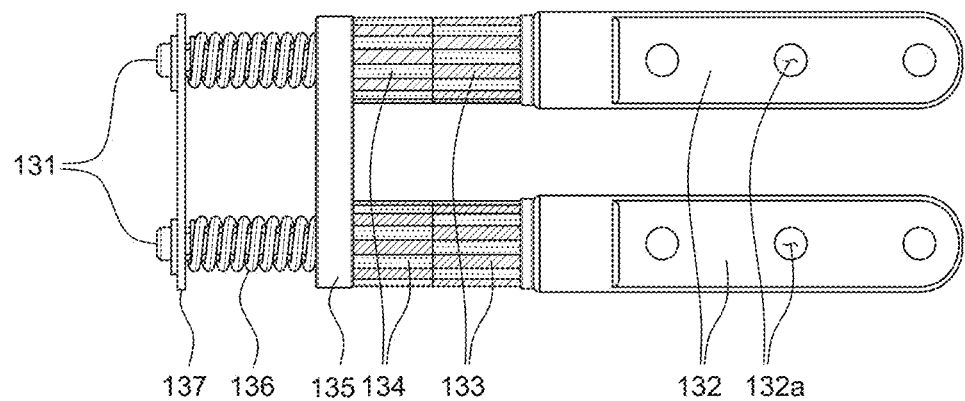
FIGS. 4A and 4B are an enlarged view and a cross-sectional view of a hinge of a foldable display device according to an exemplary embodiment of the present disclosure.
Figure 4B:
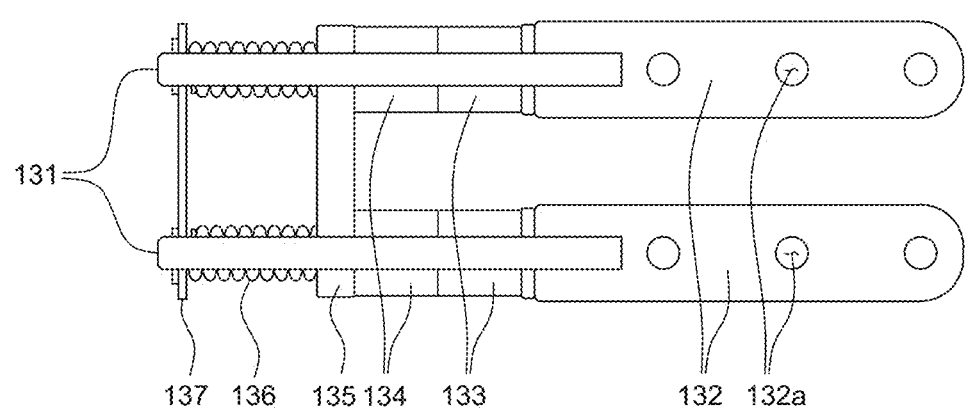
Figure 5A:
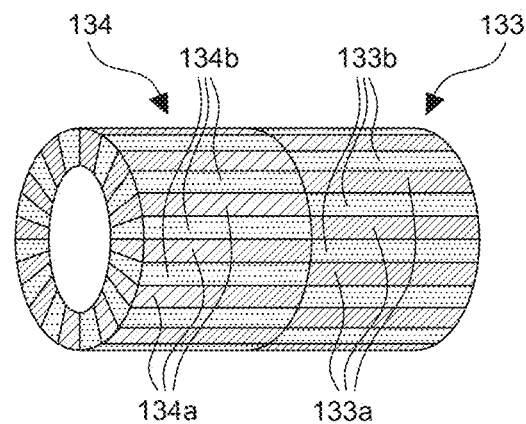
FIGS. 5A and 5B are perspective views for explaining a first holding member and a second holding member of a foldable display device according to an exemplary embodiment of the present disclosure.
Figure 5B:
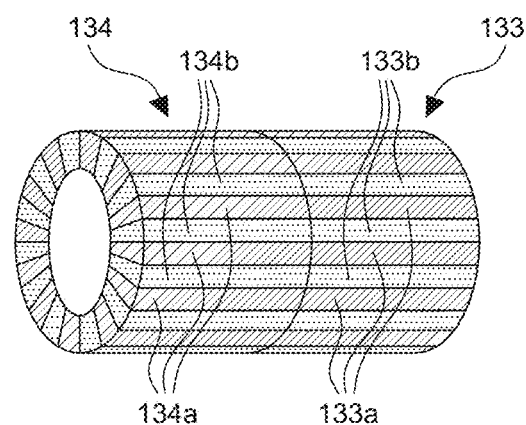

FIG. 3 is an enlarged view of a region A of FIG. 2. FIGS. 4A and 4B are an enlarged view and a cross-sectional view of a hinge of a foldable display device according to an exemplary embodiment of the present disclosure. FIGS. 5A and 5B are perspective views for explaining a first holding member and a second holding member of a foldable display device according to an exemplary embodiment of the present disclosure.

Referring to FIGS. 3 to 5B, the hinge 130 according to an exemplary embodiment of the present disclosure includes a hinge shaft 131, a rotating plate 132, a first holding member 133, a second holding member 134, a fixing frame 135, a spring 136, and a fixing plate 137.

The hinge shaft 131 may serve as a center axis to which components of the hinge 130 are coupled. A pair of hinge shafts 131 is provided to correspond to the first cover 110 and the second cover 120, respectively. That is, when the first cover 110 and the second cover 120 move, the hinge shaft 131 serves as a rotational center axis of the components coupled to the hinge shaft 131.

A pair of rotating plates 132 is provided to be coupled to one ends of one pair of hinge shafts 131. Further, the pair of rotating plates 132 may correspond to the first cover 110 and the second cover 120, respectively. That is, the pair of rotating plates 132 includes a plurality of fastening grooves 132a to be fixed to the first fastening unit 111 of the first cover 110 and the second fastening unit 121 of the second cover 120. In this case, the pair of rotating plates 132 may be fixed to the first fastening unit 111 and the second fastening unit 121 by screw connection, but is not limited thereto. Further, when the foldable display device 100 is folded or unfolded, the pair of rotating plates 132 may rotate in accordance with the movement of the first cover 110 and the second cover 120.

One pair of first holding members 133 is provided to be coupled to one pair of hinge shafts 131, respectively. Specifically, the pair of first holding members 133 is coupled to an area of the hinge shaft 131 which is adjacent to the pair of rotating plates 132. Further, the pair of first holding members 133 may be fixed to one pair of rotating plates 132 to rotate together with the pair of rotating plates 132. That is, when the foldable display device 100 is folded or unfolded, the pair of first holding members 133 may rotate together with the pair of rotating plates 132 in accordance with the movement of the first cover 110 and the second cover 120.

The pair of first holding members 133 may be formed of a magnetic substance. Specifically, the pair of first holding members 133 may be cylindrical magnets including through holes through which the hinge shafts 131 penetrate. That is, the pair of first holding members 133 may be a cylindrical magnet including an upper surface and a lower surface on which openings corresponding to the through holes are disposed and an outer surface and an inner surface which connect the upper surface and the lower surface. The upper surface and the lower surface face each other. In this case, the inner surfaces of the pair of first holding members 133 may correspond to a periphery of the hinge shaft 131.

The pair of first holding members 133 includes a plurality of negative poles 133a and a plurality of positive poles 133b. The plurality of negative poles 133a and the plurality of positive poles 133b may be alternately disposed along a direction perpendicular to the hinge shaft 131. Further, the plurality of negative poles 133a and the plurality of positive poles 133b may be alternately disposed along a specific interval to surround the hinge shaft 131. That is, the plurality of negative poles 133a and the plurality of positive poles 133b may be alternately disposed to surround a circumference of the hinge shaft 131 along a circumferential direction of the hinge shaft 131. Therefore, the pair of first holding members 133 may be cylindrical magnets configured by the plurality of negative poles 133a and the plurality of positive poles 133b which are alternately disposed along the circumferential direction of the pair of hinge shafts 131.

In this case, on the outer surface of the pair of first holding members 133, a length of a boundary line between the plurality of negative poles 133a and the plurality of positive poles 133b may be equal to a length between the upper surface and the lower surface of the pair of first holding members 133. Furthermore, a sum of the intervals of the plurality of negative poles 133a and the plurality of positive poles 133b may be equal to a circumferential length of the pair of first holding members 133 which are perpendicular to a length between the upper surface and the lower surface of the pair of first holding members 133.

In the meantime, the upper surface or the lower surface of the pair of first holding members 133 may be in contact with the upper surface or the lower surface of the pair of second holding members 134 which will be described below. In this case, on the upper surfaces or lower surfaces of the pair of first holding members 133, the plurality of negative poles 133a and the plurality of positive poles 133b may be alternately disposed along the circumference of the opening.

One pair of second holding members 134 is provided to be coupled to one pair of hinge shafts 131, respectively. Specifically, one pair of second holding members 134 is coupled to the pair of first holding members 133 to face each other in an area adjacent to the pair of first holding members 133. In this case, the pair of second holding members 134 may be fixed to the fixing frame 135 which will be described below. That is, even though the foldable display device 100 is folded or unfolded, the pair of second holding members 134 is fixed to the fixing frame 135 so as not to rotate.

The pair of second holding members 134 may have the same shape as the pair of first holding members 133. That is, the pair of second holding member 134 may be formed of a magnetic substance. Specifically, the pair of second holding members 134 may be cylindrical magnets including through holes through which the hinge shafts 131 penetrate. Further, the pair of second holding members 134 may be a cylindrical magnet in which a plurality of negative poles 134a and a plurality of positive poles 134b are alternately disposed along a direction perpendicular to the hinge shaft 131.

The upper surface or the lower surface of the pair of second holding members 134 may be in contact with the upper surface or the lower surface of the pair of first holding members 133. In this case, on the upper surfaces or lower surfaces of the pair of second holding members 134, the plurality of negative poles 134a and the plurality of positive poles 134b may be alternately disposed along the circumference of the opening.

That is, the pair of first holding members 133 and the pair of second holding members 134 are disposed such that the upper surfaces and the lower surfaces are in contact with each other while facing each other. In this case, on contact surfaces of the pair of first holding members 133 and the pair of second holding members 134, the plurality of negative poles 133a and 134a and the plurality of positive poles 133b and 134b are alternately disposed along the circumference of the opening. Therefore, on contact surfaces of the pair of first holding members 133 and the pair of second holding members 134, magnetic forces may be generated by the plurality of negative poles 133a and 134a and the plurality of positive poles 133b and 134b.

Figure 6A:
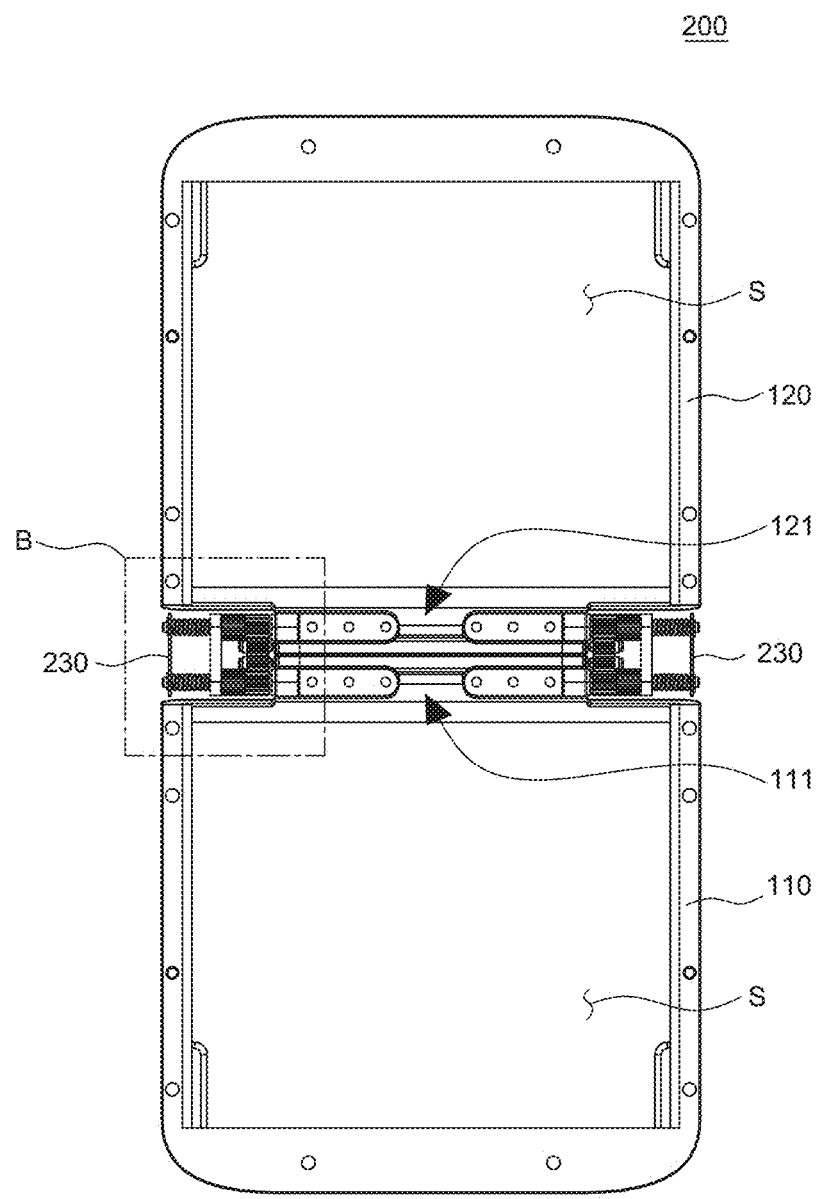
FIG. 6A is a plan view of a foldable display device according to another exemplary embodiment of the present disclosure.
Figure 6B:
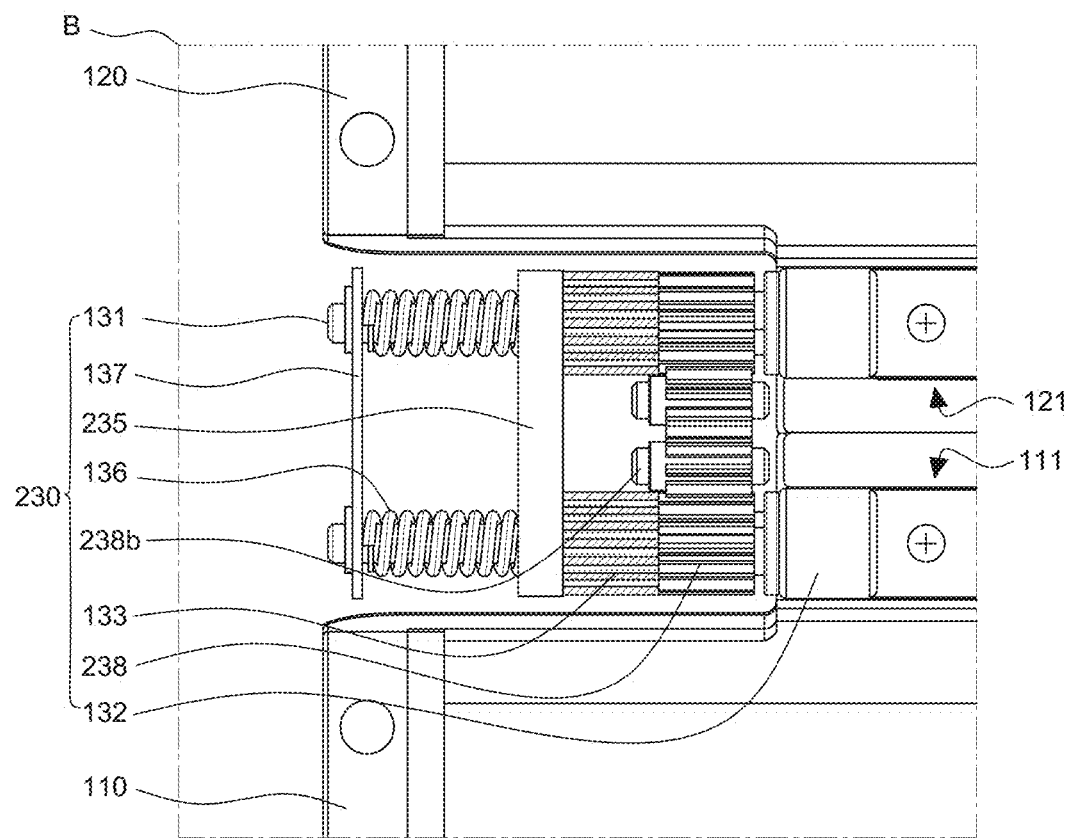
FIG. 6B is an enlarged view of a region B of FIG. 6A.

The pair of first holding members 133 and the pair of second holding members 134 may serve as holding units for implementing the holding force of the hinge 130. That is, the pair of holding units may implement a holding force so that the first cover 110 and the second cover 120 maintain a specific angle by the magnetic force. Specifically, as illustrated in FIG. 6A, when the first holding member 133 and the second holding member 134 are disposed such that different polarities face each other, an attractive force may be generated. In contrast, as illustrated in FIG. 6B, when the first holding member 133 and the second holding member 134 are disposed such that same polarities face each other, a repulsive force may be generated.

To be more specific, when the user applies a force to fold or unfold the foldable display device 100, the pair of first holding members 133 fixed to the pair of rotating plates 132 may rotate by the movement of the first cover 110 and the second cover 120. In this case, the pair of second holding members 134 may be fixed to the fixing frame 135 so as not to rotate. Therefore, the plurality of negative poles 134a and the plurality of positive poles 134b of the pair of fixed second holding members 134 may be disposed to alternately face the plurality of negative poles 133a and the plurality of positive poles 133b of the pair of rotating first holding members 133. Therefore, the holding unit may have a structure in which an attractive force or a repulsive force is repeated according to a specific angle formed by the first cover 110 and the second cover 120.

When the plurality of negative poles 133a of the pair of first holding members 133 and the plurality of positive poles 134b of the pair of second holding members 134 are disposed to face each other or the plurality of positive poles 133b of the pair of first holding members 133 and the plurality of negative poles 134a of the pair of second holding members 134 are disposed to face each other, the attractive force may be generated between the pair of first holding members 133 and the pair of second holding members 134.

In contrast, when the plurality of negative poles 133a of the pair of first holding members 133 and the plurality of negative poles 134a of the pair of second holding members 134 are disposed to face each other or the plurality of positive poles 133b of the pair of first holding members 133 and the plurality of positive poles 134b of the pair of second holding members 134 are disposed to face each other, the repulsive force may be generated between the pair of first holding members 133 and the pair of second holding members 134.

In the meantime, the external force which is applied to the foldable display device 100 by the user may be larger than the attractive force and the repulsive force between the pair of first holding members 133 and the pair of second holding members 134. Therefore, even though the attractive force and the repulsive force are generated between the pair of first holding members 133 and the pair of second holding members 134, the user may fold or unfold the foldable display device 100 at a desired angle.

However, when the repulsive force is generated between the pair of first holding members 133 and the pair of second holding members 134, the user may more easily perform the folding or unfolding operation of the foldable display device 100 by a pushing force between magnets. That is, when the repulsive force is generated in the pair of holding units, the pair of first holding members 133 and the pair of second holding members 134 may be minutely spaced apart from each other by the repulsive force. In this case, the friction between the pair of first holding members 133 and the pair of second holding members 134 may be minimized. In other words, when the repulsive force is generated in the holding unit, the friction between the pair of first holding members 133 and the pair of second holding members 134 may be minimized as compared with the case that the attractive force is generated in the holding unit.

The pair of first holding members 133 and the pair of second holding members 134 include the plurality of negative poles 133a and 134a and the plurality of positive poles 133b and 134b along a specific interval, respectively so that a plurality of friction minimizing sections in which the friction is minimized may be provided. That is, the pair of first holding members 133 and the pair of second holding members 134 are disposed along a specific interval such that the same polarities face each other. Therefore, the friction between the pair of first holding members 133 and the pair of second holding members 134 may be minimized. In the friction minimizing section, the user may more easily perform the folding or unfolding operation of the foldable display device 100.

In contrast, when the pair of first holding members 133 and the pair of second holding members 134 are disposed along a specific interval such that different polarities face each other, the friction between the pair of first holding members 133 and the pair of second holding members 134 may be increased. That is, when the attractive force is generated in the holding unit, the attractive force and the friction between the pair of first holding members 133 and the pair of second holding members 134 may be maximized as compared with the case that the repulsive force is generated in the holding unit. The holding force of the foldable display device 100 may be most strongly maintained in this section.

When the external force which is applied to the foldable display device 100 at a specific folding angle is removed, the foldable display device 100 may maintain the specific folding angle by a magnetic force between the pair of first holding members 133 and the pair of second holding members 134.

That is, when the attractive force is generated between the pair of first holding members 133 and the pair of second holding members 134, the pair of first holding members 133 stops rotation and is fixed to the pair of second holding members 134 so that the holding force may be generated. In contrast, when the repulsive force is generated between the pair of first holding members 133 and the pair of second holding members 134, the pair of first holding members 133 may rotate to generate the attractive force with the pair of second holding members 134. As a result, the pair of first holding members 133 is fixed to the pair of second holding members 134 by the rotation and thus the holding force may be generated therefrom.

Specifically, when the first holding members 133 and the second holding members 134 are disposed such that different polarities face each other, the pair of first holding members 133 may be fixed to the pair of second holding members 134 by the attractive force. Further, as the rotation of the pair of first holding members 133 stops, rotation of the pair of rotating plates 132 may stop. Further, as the rotation of the pair of rotating plates 132 stops, the movement of the first cover 110 and the second cover 120 may stop. That is, the first cover 110 and the second cover 120 of the foldable display device 100 may be fixed to form a specific folding angle by the attractive force between the pair of first holding members 133 and the pair of second holding members 134.

In contrast, when the pair of first holding members 133 and the pair of second holding members 134 are disposed such that the same polarities face each other, the first holding members 133 may be pushed by the repulsive force. In this case, since magnets have a property of attracting different polarities, the pair of first holding members 133 may rotate in a direction in which the attractive force with the pair of second holding members 134 works. Further, the pair of first holding members 133 and the pair of second holding members 134 may have a pattern in which the plurality of negative poles 133a and 134a and the plurality of positive poles 133b and 134b are alternately disposed. Therefore, the attractive force may be generated between the pair of first holding members 133 and the pair of second holding members 134 only by the minute rotation of the pair of first holding members 133. As a result, the attractive force works between the pair of first holding members 133 and the pair of second holding members 134 so that the first cover 110 and the second cover 120 may be fixed to form a specific folding angle.

In the meantime, since the pair of first holding members 133 and the pair of second holding members 134 include the plurality of negative poles 133a and 134a and the plurality of positive poles 133b and 134b, the foldable display device 100 may have various folding angles. That is, the first cover 110 and the second cover 120 may be fixed at angles corresponding to the plurality of negative poles 133a and 134a and the plurality of positive poles 133b and 134b. Therefore, the folding angle of the foldable display device 100 may be controlled by adjusting the number of the plurality of negative poles 133a and 134a and the plurality of positive poles 133b and 134b of the pair of first holding members 133 and the pair of second holding members 134 and the intervals therebetween.

In this case, even though the intervals between the plurality of negative poles 133a and 134a and the plurality of positive poles 133b and 134b are reduced, the holding force of the pair of first holding members 133 and the pair of second holding members 134 may be uniformly maintained. That is, since the pair of first holding members 133 and the pair of second holding members 134 are formed to be same, when the attractive force is generated, different polarities may face each other on the entire contact surface between the pair of first holding members 133 and the pair of second holding members 134. Therefore, the attractive force is generated on the entire contact surface between the pair of first holding members 133 and the pair of second holding members 134 so that the holding force may be uniformly maintained.

Further, the strength of the holding force of the foldable display device 100 may be controlled by adjusting a strength of the magnetic force of the permanent magnets applied to the pair of first holding members 133 and the pair of second holding members 134.

The fixing frame 135 is coupled to the pair of hinge shafts 131 and fixes the pair of second holding members 134. That is, the fixing frame 135 may include through holes through which the pair of hinge shafts 133 penetrates, at one side and the other side. Further, the fixing frame 135 is fixed to the pair of second holding members 134 to suppress the rotation of the pair of second holding members 134. The fixing frame 135 may be formed of a metal or plastic material, but the present disclosure is not limited thereto.

A pair of springs 136 is provided to be fixed to the pair of hinge shafts 131. In this case, the pair of springs 136 is disposed at opposite sides of the pair of first holding members 133 and the pair of second holding members 134 with respect to the fixing frame 135.

In this case, the pair of springs 136 is compressed by the fixing frame 135 and the fixing plate 131 which will be described below to have an elastic force. Therefore, a pressure is applied to the fixing frame 135 due to the elastic force of the pair of springs 136 and thus a surface friction force may be provided between the pair of first holding members 133 and the pair of second holding members 134. When the folding angle of the foldable display device 100 is maintained, the rotation of the first holding members 133 may be suppressed by the surface friction force. That is, the folding angle between the first cover 110 and the second cover 120 may be further firmly maintained by the pair of springs 136. However, the pair of springs 136 may be omitted if necessary.

The fixing plate 137 is fixed to the other ends of the pair of hinge shafts 131. The fixing plate 137 may serve to fix the components of the hinge 130. That is, the fixing plate 137 is disposed at the other ends of the pair of hinge shafts 131 to suppress the components fixed to the hinge shaft 131 from being left from the hinge shafts 131. Further, the fixing plate 137 pressurizes the pair of springs 136 to cause the pair of springs 136 to generate the elastic force. Further, a component such as a screw is fastened to a side of the fixing plate 137 which is opposite to the spring 136, so that the fixing plate 137 and the pair of hinge shafts 131 may be further firmly coupled to each other.

A general hinge implements the holding force by the frictional force between the hinge components to maintain the specific folding angle of the foldable display device. However, the hinge components are worn out due to the frictional force caused by the consistent folding and unfolding operation, so that the holding force is decreased and the durability of the hinge and the foldable display device is lowered.

Therefore, in the foldable display device 100 according to the exemplary embodiment of the present disclosure, a permanent magnet is applied to the hinge 130 so that the holding force for maintaining the folding angle of the foldable display device 100 may be implemented. That is, the holding force may be implemented using the magnetic force between the pair of first holding members 133 and the pair of second holding members 134 including the plurality of negative poles 133a and 134b and the plurality of positive poles 133b and 134b. Specifically, when the pair of first holding members 133 and the pair of second holding members 134 are disposed such that different polarities face each other to generate the attractive force therebetween, the first cover 110 and the second cover 120 may be fixed at a specific folding angle by the attractive force.

Further, the foldable display device 100 according to the exemplary embodiment of the present disclosure may implement the permanent holding force by the magnetic force between the permanent magnets. That is, even though the pair of first holding members 133 and the pair of second holding members 134 are in contact with each other to cause friction, the magnetic force may be consistently maintained. Therefore, the holding force of the hinge 130 may be permanently maintained. As a result, the decrease of the holding force is reduced so that the durability of the foldable display device 100 may be improved.

Further, the foldable display device 100 according to the exemplary embodiment of the present disclosure may implement the holding force only using the first holding members 133 and the second holding members 134, so that the structure of the hinge 130 may be simplified. Therefore, the number of components of the hinge 130 is reduced and the forming step is simplified, so that the manufacturing cost may be saved.

Hereinafter, a configuration of a hinge of a foldable display device according to another exemplary embodiment of the present disclosure will be described with reference to FIGS. 6A and 6B.

FIG. 6A is a plan view of a foldable display device according to another exemplary embodiment of the present disclosure. FIG. 6B is an enlarged view of a region B of FIG. 6A.

Referring to FIGS. 6A and 6B, a hinge 230 according to another exemplary embodiment of the present disclosure includes a hinge shaft 131, a rotating plate 132, a first holding member 133, a fixing frame 235, a spring 136, a fixing plate 137, and a gear 238. Here, the hinge shaft 131, the rotating plate 132, the first holding member 133, the spring 136, and the fixing plate 137 have the same configuration as the hinge 130 which has been described above, so that a redundant description will be omitted.

A pair of gears 238 is provided to be coupled to the pair of hinge shafts 131 between the pair of rotating plates 132 and the pair of first holding members 133. The pair of gears 238 is fixed to the pair of rotating plates 132 to rotate together. That is, when the foldable display device 100 is folded or unfolded, the pair of gears 238 may rotate together with the pair of rotating plates 132 in accordance with the movement of the first cover 110 and the second cover 120.

A pair of auxiliary gears 238a which is disposed to be engaged with each other is disposed between the pair of gears 238. Further, the pair of auxiliary gears 238a may be disposed to be engaged with the pair of gears 238 between the pair of gears 238 which is spaced apart from each other. Further, the pair of gears 238 and the pair of auxiliary gears 238a may be protected by a guide rail.

The pair of gears 238 and the pair of auxiliary gears 238a are disposed to be engaged with each other so that the rotation of the rotating plate 132 and the movement of the first cover 110 and the second cover 120 may be more smoothly performed. In the meantime, the pair of gears 238 and the pair of auxiliary gears 238a may be omitted if necessary.

The pair of first holding members 133 is fixed to the pair of gears 238. Therefore, the pair of first holding members 133 may rotate together with the pair of gears 238. That is, when the foldable display device 100 is folded or unfolded, the pair of first holding members 133 may rotate together with the pair of rotating plates 132 and the pair of gears 238 in accordance with the movement of the first cover 110 and the second cover 120.

The fixing frame 235 is formed of a metal material and is coupled to the pair of hinge shafts 131. In this case, the fixing frame 235 is in contact with the pair of first holding members 133. Since the fixing frame 235 is formed of metal, the magnetic force may be generated between the fixing frame 235 and the pair of first holding members 133. That is, in the hinge 130 of the foregoing exemplary embodiment, the pair of second holding members 134 is disposed between the fixing frame 135 and the pair of first holding members 133 so that the holding force may be implemented by the attractive force between the pair of first holding members 133 and the pair of second holding members 134. However, in the hinge 230 according to another exemplary embodiment of the present disclosure, the second holding member 134 is omitted and the holding force is implemented by the attractive force between the metallic fixing frame 235 and the pair of first holding members 133.

The pair of springs 136 is disposed at an opposite side of the pair of first holding members 133 with respect to the fixing frame 235. Further, the pair of springs 136 may have an elastic force by the fixing frame 235 and the fixing plate 131. The surface friction force may be provided between the fixing frame 235 and the pair of first holding members 133 from the elastic force of the pair of springs 136. When the folding angle of the foldable display device is maintained, the rotation of the first holding members 133 may be suppressed by the surface friction force.

In the hinge 230 according to another exemplary embodiment of the present disclosure, when the user folds or unfolds the foldable display device, the pair of rotating plates 132, the pair of gears 238, and the pair of first holding members 133 may rotate together in accordance with the movement of the first cover 110 and the second cover 120. In this case, the external force applied by the user may be larger than the attractive force and the surface friction force between the pair of first holding members 133 and the fixing frame 235. Therefore, the user may fold or unfold the foldable display device at a desired angle.

Further, when the external force which is applied to the foldable display device at a specific folding angle is removed, the folding angle of the foldable display device may be maintained by the attractive force and the surface friction force between the pair of first holding members 133 and the fixing frame 235. That is, the pair of first holding members 133 stops rotating by the attractive force and the surface friction force and is fixed to the fixing frame 235 so that the holding force may be generated.

Specifically, the pair of first holding members 133 may be fixed to the fixing frame 235 by the attractive force and the surface friction force. As the rotation of the pair of first holding members 133 stops, rotation of the pair of gears 238 and the pair of rotating plates 132 may stop. Further, as the rotation of the pair of rotating plates 132 stops, the movement of the first cover 110 and the second cover 120 may stop. That is, the first cover 110 and the second cover 120 of the foldable display device may be fixed to form a specific folding angle by the attractive force and the surface friction force between the pair of first holding members 133 and the fixing frame 235.

As compared with the hinge 130 of the foregoing exemplary embodiment, since the pair of second holding members 134 is omitted from the hinge 230 according to another exemplary embodiment of the present disclosure, the operation of the hinge 230 may be more simply performed. That is, the holding force is implemented only by the attractive force and the surface friction force between the pair of first holding members 133 and the fixing frame 235 so that the precision of the operation of the hinge 230 may be improved as compared with the case that all the attractive force, the repulsive force, and the surface friction force work.

Further, the hinge 230 according to another exemplary embodiment of the present disclosure implements the holding force by the interaction of the pair of first holding members 133 and the metal fixing frame 235 so that the structure of the first holding members 133 may be further simplified. Accordingly, the manufacturing cost of the hinge 230 may be saved.

Hereinafter, a configuration of a hinge of a foldable display device according to still another exemplary embodiment of the present disclosure will be described with reference to FIGS. 7A and 7B.

Figure 7A:
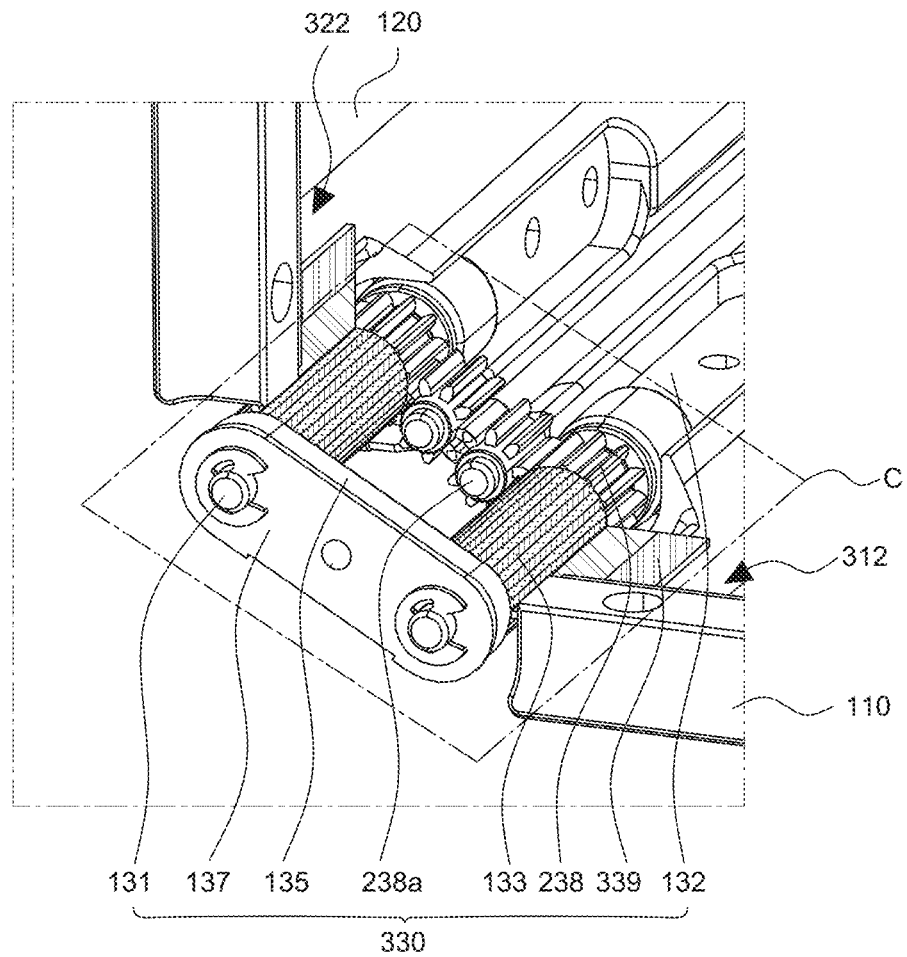
FIG. 7A is a perspective view of a foldable display device according to still another exemplary embodiment of the present disclosure.

FIG. 7A is a perspective view of a foldable display device according to still another exemplary embodiment of the present disclosure. FIG. 7B is an enlarged view of a region C of FIG. 7A.

Figure 7B:
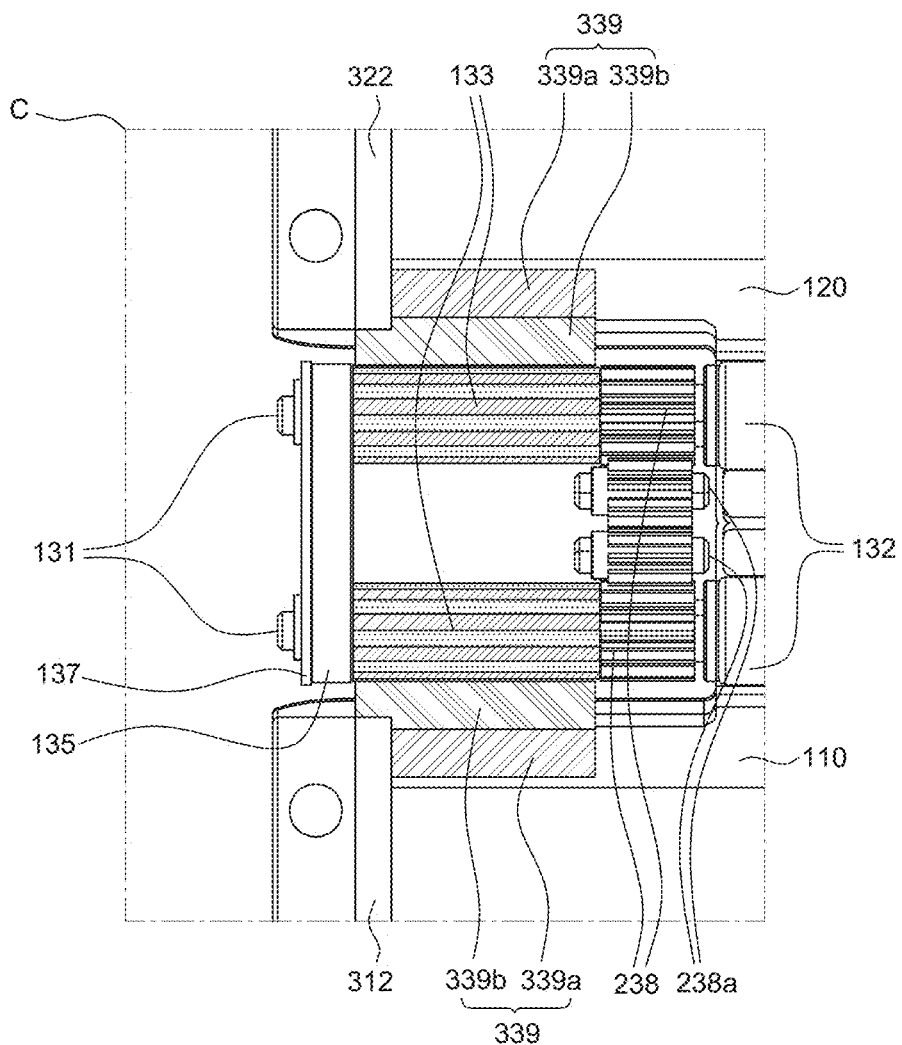
FIG. 7B is an enlarged view of a region C of FIG. 7A.

Referring to FIGS. 7A and 7B, a hinge 330 according to another exemplary embodiment of the present disclosure includes a hinge shaft 131, a rotating plate 132, a first holding member 133, a fixing frame 135, a fixing plate 137, a gear 238, and a third holding member 339. Here, the hinge shaft 131, the rotating plate 132, the first holding member 133, the fixing frame 135, the fixing plate 137, and the gear 238 have the same configuration as the hinges 130 and 230 which have been described above, so that a redundant description will be omitted.

The pair of gears 238 is coupled to the pair of hinge shafts 131 between the pair of rotating plates 132 and the pair of first holding members 133. The pair of gears 238 is fixed to the pair of rotating plates 132 to rotate together with the rotating plate 132. Further, the pair of auxiliary gears 238a which is disposed to be engaged with each other is disposed between the pair of gears 238. The pair of gears 238 and the pair of auxiliary gears 238a are disposed to be engaged with each other so that the rotation of the rotating plate 132 and the movement of the first cover 110 and the second cover 120 may be more smoothly performed.

The pair of first holding members 133 is disposed between the pair of gears 238 and the fixing frame 135. In this case, the pair of first holding members 133 may be fixed to the fixing frame 135. That is, in the foregoing exemplary embodiments, the pair of first holding members 133 rotates by the rotation of the rotating plate 132, but in the hinge 330 according to another exemplary embodiment of the present disclosure, the pair of first holding members 133 may be fixed without rotating.

As described with reference to FIGS. 6A and 6B, the pair of first holding members 133 may be cylindrical magnets with through holes through which the hinge shaft 131 penetrates. Further, the pair of first holding members 133 includes a plurality of negative poles 133a and a plurality of positive poles 133b. In this case, the plurality of negative poles 133a and the plurality of positive poles 133b may be alternately disposed along a direction perpendicular to the hinge shaft 131.

The fixing frame 135 and the fixing plate 136 are fixed to the other end of the pair of hinge shafts 131. The fixing frame 135 and the fixing plate 136 may be disposed to be in contact with each other. That is, even though the pair of springs 136 is disposed between the fixing frame 135 and the fixing plate 136 in the foregoing exemplary embodiments, the pair of springs may be omitted here. In other words, the pair of first holding members 133 is configured to be fixed, the pair of springs 136 which provides the surface friction force to the pair of first holding members 133 may be omitted.

In the meantime, any one of the fixing frame 135 and the fixing plate 136 may be omitted if necessary. Further, the fixing frame 135 may be formed of a metal or plastic material, but the present disclosure is not limited thereto.

A pair of third holding members 339 may be provided to be adjacent to the pair of first holding members 133. In this case, the pair of third holding members 339 and the pair of first holding members 133 may be disposed to be spaced apart from each other or to be in contact with each other. When the pair of third holding members 339 and the pair of first holding members 133 are spaced apart from each other, friction between the third holding members and the first holding members is reduced to ensure high durability. When the pair of third holding members 339 and the pair of first holding members 133 are in contact with each other, the distance between the third holding members and the first holding members is close, so that the magnetic force may be further increased.

Each of the pair of third holding members 339 is fixed to the first cover 110 and the second cover 120. The pair of third holding members 339 may be fixed to the first fixing unit 312 and the second fixing unit 322 disposed at edges of the first cover 110 and the second cover 120, respectively. Accordingly, when the foldable display device 100 is folded or unfolded, the pair of third holding members 339 may move in accordance with the movement of the first cover 110 and the second cover 120.

The pair of third holding members 339 may be flat magnets. Further, the pair of third holding members 339 includes at least one of negative poles 339a and positive poles 339b. One of the negative poles 339a and positive poles 339b of the pair of third holding members 339 may be disposed to face the pair of first holding members 133. Therefore, the holding force of the hinge 330 may be implemented by the magnetic force generated by any one of the negative poles 339a and positive poles 339b of the pair of third holding members 339 and any one of the plurality of negative poles 133a and the plurality of positive poles 133b of the pair of first holding members 133. In the meantime, although in the drawing, it is illustrated the negative poles 339a of the pair of third holding members 339 face the hinge 330, the present disclosure is not limited thereto.

When the pair of first holding members 133 and the pair of third holding members 339 are disposed such that different polarities face each other, an attractive force may be generated. In contrast, when the pair of first holding members 133 and the pair of third holding members 339 are disposed such that same polarities face each other, a repulsive force may be generated.

In the hinge 330 according to another exemplary embodiment of the present disclosure, when the user folds or unfolds the foldable display device, the pair of third holding members 339 may move in accordance with the movement of the first cover 110 and the second cover 120. In this case, the pair of first holding members 133 may be fixed to the fixing frame 135 so as not to rotate. Therefore, one of the negative poles 339a and the positive poles 339b of the pair of moving third holding members 339 may be disposed to alternately face the plurality of negative poles 133a and the plurality of positive poles 133b of the pair of fixed first holding members 330.

In the meantime, the external force applied by the user may be larger than the attractive force and the repulsive force between the pair of first holding members 133 and the pair of third holding members 339. Therefore, even though the attractive force and the repulsive force are generated between the pair of first holding members 133 and the pair of third holding members 339, which face each other, the user may fold or unfold the foldable display device at a desired angle.

Further, when the external force which is applied to the foldable display device at a specific folding angle is removed, the folding angle of the foldable display device may be maintained by the magnetic force between the pair of first holding members 133 and the pair of third holding members 339.

Specifically, when the pair of third holding members 339 and the pair of first holding members 133 are disposed such that different polarities face each other, the movement of the pair of third holding members 339 may stop by the attractive force. As the pair of third holding members 339 is fixed by the attractive force, the movement of the first cover 110 and the second cover 120 may stop. That is, the first cover 110 and the second cover 120 of the foldable display device may be fixed to form a specific folding angle by the attractive force between the pair of third holding members 339 and the pair of first holding members 133.

In contrast, when the pair of third holding members 339 and the pair of first holding members 133 are disposed such that the same polarities face each other, the third holding members 339 may be pushed by the repulsive force. In this case, since magnets have a property of attracting different polarities, the pair of third holding members 339 may move in a direction in which the attractive force with the pair of first holding members 133 works. Further, since the pair of first holding members 133 has a pattern in that the plurality of negative poles 133a and the plurality of positive poles 133b are alternately disposed, the attractive force may be generated between the pair of first holding members 133 and the pair of third holding members 339 only by the minute movement of the pair of third holding members 339. As a result, the attractive force works between the pair of third holding members 339 and the pair of first holding members 133, so that the first cover 110 and the second cover 120 may be fixed to form a specific folding angle.

As compared with the hinges 130 and 230 of the foregoing exemplary embodiments, a structure of the hinge 330 according to another exemplary embodiment of the present disclosure may be more simplified. That is, the surface friction force between the pair of first holding members 133 and the pair of third holding members 339 which configure the hinge 330 does not necessary, so that the spring 136 may be omitted. Accordingly, the manufacturing cost of the hinge 330 may be saved.

Hereinafter, a foldable display device according to still another exemplary embodiment of the present disclosure will be described.

Figure 8:
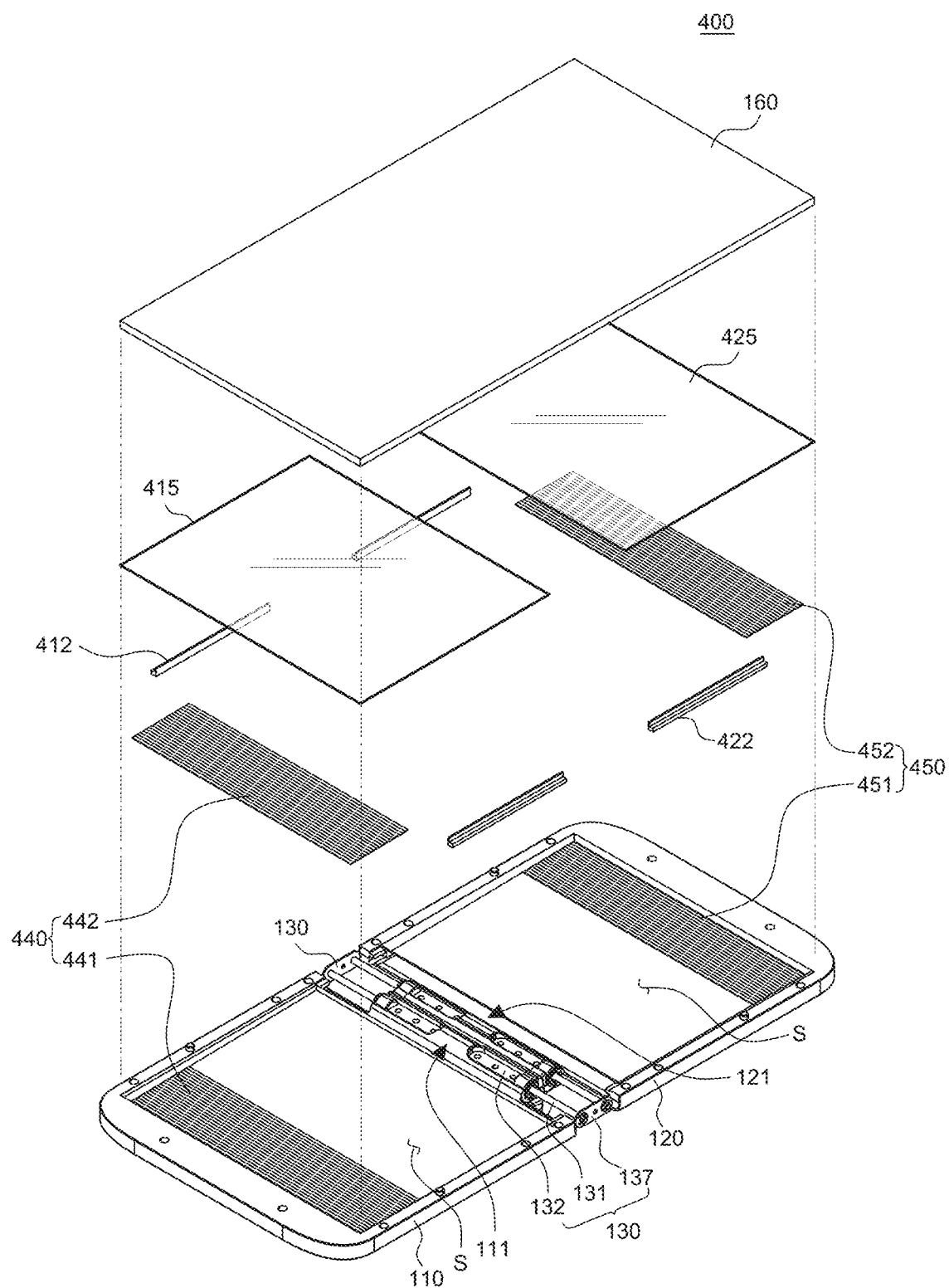
FIG. 8 is a schematic exploded perspective view of a foldable display device according to another exemplary embodiment of the present disclosure.
Figure 9:
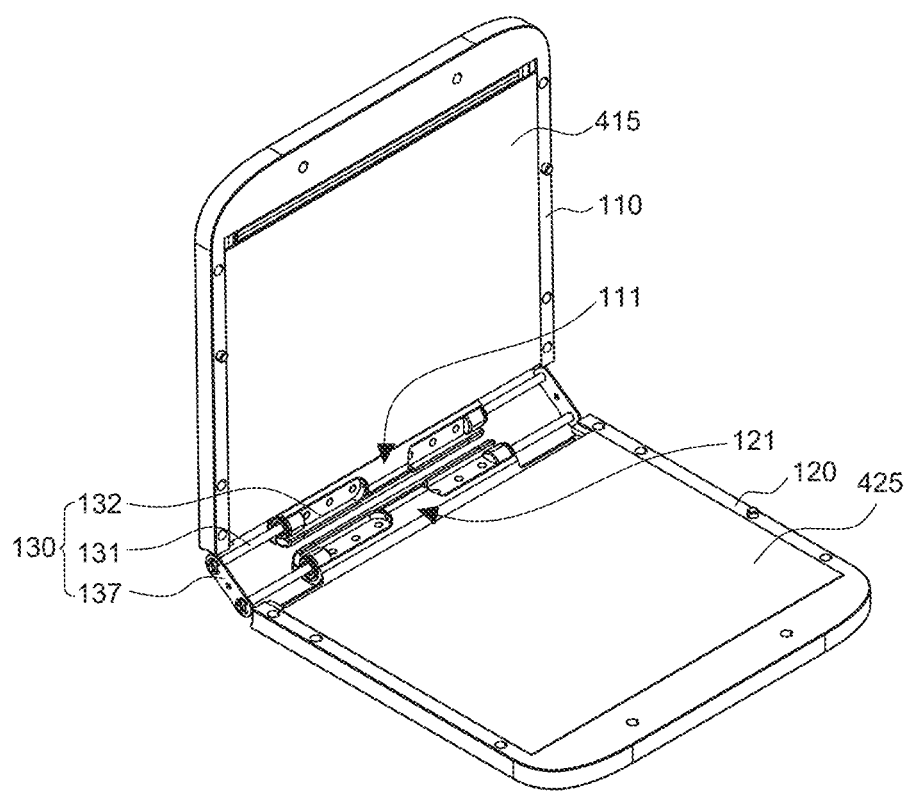
FIG. 9 is a perspective view of a foldable display device according to still another exemplary embodiment of the present disclosure.
Figure 10A:
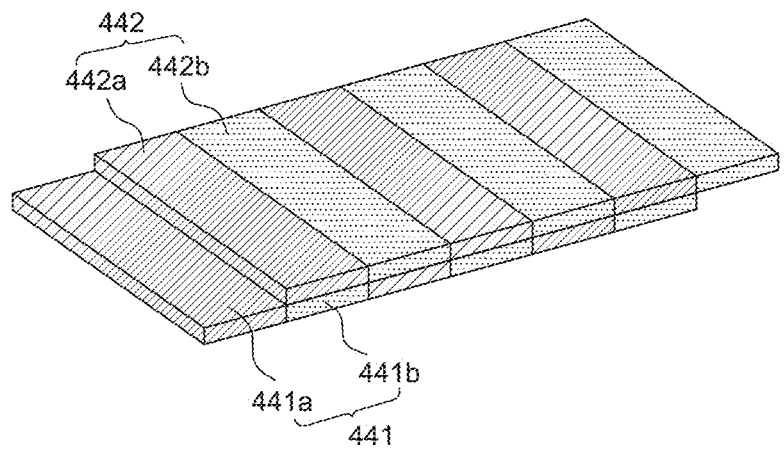
FIGS. 10A and 10B are perspective views for explaining a first holding unit according to still another exemplary embodiment of the present disclosure.
Figure 10B:
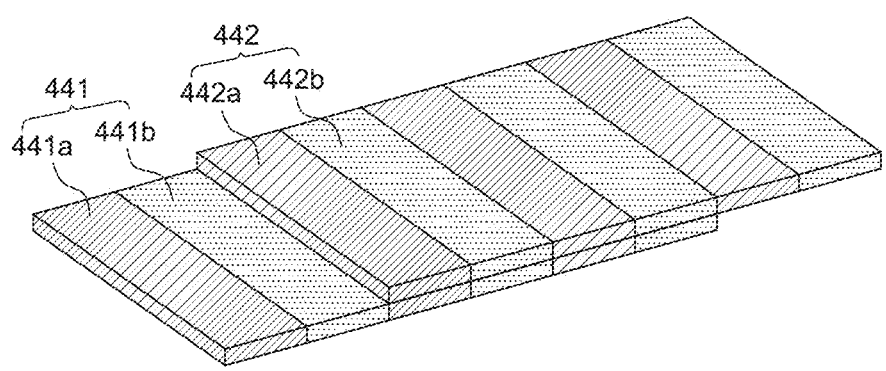

FIG. 8 is a schematic exploded perspective view of a foldable display device according to another exemplary embodiment of the present disclosure. FIG. 9 is a perspective view of a foldable display device according to still another exemplary embodiment of the present disclosure. FIGS. 10A and 10B are perspective views for explaining a first holding unit according to still another exemplary embodiment of the present disclosure.

Referring to FIGS. 8 and 9, a foldable display device 400 according to another exemplary embodiment of the present disclosure includes a first cover 110, a second cover 120, a first slide plate 415, a second slide plate 425, a hinge 130, a first holding unit 440, a second holding unit 450, and a display panel 160. In FIG. 8, even though components of the foldable display device 400 are briefly illustrated for the convenience of description, actually, various components for driving the foldable display device 400 may be further included. Further, in FIG. 9, for the convenience of description, the display panel 160 is omitted.

As compared with the foldable display devices 100 and 200 of the foregoing exemplary embodiments, the foldable display device 400 of FIGS. 8 and 9 may further include the first slide plate 415, the second slide plate 425, the first holding unit 440, and the second holding unit 450 and the holding members 133, 134, and 339 may be omitted from the hinge 130. That is, in the foregoing exemplary embodiments, the hinge 130 includes the holding members 133, 134, and 339 to implement the holding force of the foldable display devices 100 and 200. However, in the foldable display device 400 which will be described below, the holding force is implemented by the first holding unit 440 and the second holding unit 450. Therefore, the redundant description for the same configuration will be omitted below.

The first cover 110 and the second cover 120 may be base members for supporting the display panel 160 and various components of the foldable display device 400. Further, each of the first cover 110 and the second cover 120 may include an accommodating unit S which accommodates various components for driving the foldable display device 400.

The foldable display device 400 may maintain a specific folding angle by the holding force provided from the first holding unit 440 and the second holding unit 450 which will be described below. In other words, the first cover 110 and the second cover 120 may maintain a specific folding angle by the magnetic force of a permanent magnet which configures the first holding unit 440 and the second holding unit 450. Therefore, the foldable display device 400 is folded at a specific angle as intended by the user and maintains a folded state at the specific angle by the holding force of the first holding unit 440 and the second holding unit 450.

In the accommodating unit S of each of the first cover 110 and the second cover 120, the first slide plate 415 and the second slide plate 425 are disposed. The first slide plate 415 and the second slide plate 425 are plate-type slides and move back and forth in the accommodating unit S by a sliding operation. Further, the first slide plate 415 and the second slide plate 425 may be fixed to one side and the other side of the display panel 160.

When the foldable display device 400 is folded, the first sliding plate 415 may slide by the folding of the display panel 160. Specifically, the first slide plate 415 may slide back and forth along a first direction perpendicular to a boundary line of the first cover 110 and the second cover 120.

Specifically, when the foldable display device 400 is folded, the first slide plate 415 may slide along the first direction to be far away from the boundary line or approach the boundary line. Here, when the foldable display device 400 is in-folded, the first slide plate 415 may slide to be far away from the boundary line. Further, when the foldable display device 400 is out-folded, the first slide plate 415 may slide to be closer to the boundary line.

When the foldable display device 400 is folded, the second sliding plate 425 may slide by the folding of the display panel 160. Specifically, the second slide plate 425 may slide back and forth along the above-described first direction.

Specifically, when the foldable display device 400 is folded, the second slide plate 425 may slide along the first direction to be far away from the first cover 110 or approach the first cover 110. Here, when the foldable display device 400 is in-folded, the second slide plate 425 may slide to be far away from the boundary line. Further, when the foldable display device 400 is out-folded, the second slide plate 425 may slide to be closer to the boundary line.

One side and the other side of the display panel 160 are fixed to the first slide plate 415 and the second slide plate 425 so that when the foldable display device 400 is folded, the sliding operation may be performed on one side and the other side of the display panel 160. That is, the one side and the other side of the display panel 160 may slide back and forth along the first direction by the folding of the foldable display device 400. Therefore, the damage of the display panel 160 caused by the folding of the foldable display device 400 may be avoided.

Specifically, the display panel 160 may also be folded to form a curved surface at a central portion of the foldable display device 400, that is, in the boundary area of the first cover 110 and the second cover 120. Therefore, when one side and the other side of the display panel 160 are fixed to the first cover 110 and the second cover 120 so as not to move, tension may be generated in a curved area of the display panel 160. Specifically, when the foldable display device 400 is out-folded, one side and the other side of the display panel 160 fixed to the first cover 110 and the second cover 120 are pulled in different directions by the first cover 110 and the second cover 120, so that the tension may be maximized. The tension may cause damage of the display panel 160, which may be a cause of failure of the foldable display device 400.

However, one side and the other side of the display panel 160 are fixed to the first slide plate 415 and the second slide plate 425 so that when the foldable display device 400 is folded, one side and the other side of the display panel 160 may move together with the first slide plate 415 and the second slide plate 425. Therefore, the tension generated in the curved area of the display panel 160 is relaxed and the damage of the display panel 160 may be minimized.

In the meantime, in FIG. 8, it is illustrated that both the first slide plate 415 and the second slide plate 425 are disposed in both the first cover 110 and the second cover 120. However, any one of the first slide plate 415 and the second slide plate 425 may be omitted.

For example, in the foldable display device 400, the second slide plate 425 may be omitted. In this case, one side of the display panel 160 is fixed to the first slide plate 415 to move by folding the foldable display device 400 and the other side may be fixed to the second cover 120. When one side of the display panel 160 moves and the other side is fixed, the display panel 160 may be more stably folded as compared with the case that both sides of the display panel 160 move. Therefore, a damage of the foldable display device 400 may be further reduced.

Both sides of each of the first slide plate 415 and the second slide plate 425 are coupled to the pair of first slide rails 412 and the pair of second slide rails 422. In this case, the pair of first slide rails 412 and the pair of second slide rails 422 may be disposed in the accommodating unit of the first cover 110 and the second cover 120. Further, the pair of first slide rails 412 may be spaced apart from each other to face each other and the pair of second slide rails 422 may be spaced apart from each other to face each other. Further, the pair of first slide rails 412 and the pair of second slide rails 422 may be formed to extend in a direction parallel to the first direction. Therefore, the first slide plate 415 and the second slide plate 425 are coupled to the pair of first slide rails 412 and the pair of second slide rails 422 to move along the first direction.

In the meantime, when one of the first slide plate 415 and the second slide plate 425 is omitted, the pair of first slide rails 412 or the pair of second slide rails 422 corresponding thereto may be omitted.

A pair of hinges 130 is provided to connect one side and the other side of the first fastening unit 111 and the second fastening unit 121. The hinge 130 is disposed in a portion where the foldable display device 100 is folded and unfolded to allow the foldable display device 100 to be easily folded and unfolded.

The hinge 130 includes a hinge shaft 131, a rotating plate 132, and a fixing frame 137.

The hinge shaft 131 may serve as a center axis to which components of the hinge 130 are coupled. A pair of hinge shafts 131 is provided to correspond to the first cover 110 and the second cover 120, respectively. That is, in one hinge 130, a pair of hinge shafts 131 corresponding to the first cover 110 and the second cover 120 may be provided.

A pair of rotating plates 132 is provided to be coupled to one ends of one pair of hinge shafts 131. Further, the pair of rotating plates 132 may correspond to the first cover 110 and the second cover 120, respectively. That is, the pair of rotating plates 132 may be fixed to the first fastening unit 111 of the first cover 110 and the second fastening unit 121 of the second cover 120. In this case, the pair of rotating plates 132 may be fixed to the first fastening unit 111 and the second fastening unit 121 by screw connection, but is not limited thereto. Further, when the foldable display device 400 is folded or unfolded, the pair of rotating plates 132 may rotate in accordance with the movement of the first cover 110 and the second cover 120.

The fixing frame 137 is fixed to the other ends of the pair of hinge shafts 131. Further, the fixing frame 137 may include through holes through which the pair of hinge shafts 131 penetrates, at one side and the other side. The fixing frame 137 may serve to fix the components of the hinge 130. That is, the fixing frame 137 is disposed at the other ends of the pair of hinge shafts 131 to suppress the components fixed to the hinge shaft 131 from being left from the hinge shafts 131. Further, components such as a screw are provided at the outer side of the fixing frame 137 to be fastened with the hinge shafts 131 so that the fixing frame 137 and the pair of hinge shafts 131 may be more firmly coupled to each other.

The first holding unit 440 and the second holding unit 450 are disposed in the accommodating units S of the first cover 110 and the second cover 120, respectively. The first holding unit 440 is disposed between an inner surface of the first cover 110 and the first slide plate 415. The second holding unit 450 is disposed between an inner surface of the second cover 120 and the second slide plate 425. The first holding unit 440 and the second holding unit 450 may provide a holding force for fixing the foldable display device 400 at a specific folding angle. Specifically, the first holding unit 440 and the second holding unit 450 include permanent magnets to fix the first cover 110 and the second cover 120 at a specific folding angle by the magnetic force.

Even though in FIG. 8, it is illustrated that both the first holding unit 440 and the second holding unit 450 are disposed on the first cover 110 and the second cover 120, when any one of the first slide plate 415 and the second slide plate 425 is omitted, the first holding unit 440 or the second holding unit 450 corresponding thereto may also be omitted. The first holding unit 440 and the second holding unit 450 have the same configuration except that the first holding unit 440 and the second holding unit 450 are disposed in the first cover 110 and the second cover 120, respectively. Therefore, hereinafter, the first holding unit 440 will be mainly described.

Referring to FIGS. 10A and 10B, the first holding unit 440 includes a first holding plate 441 and a second holding plate 442. The first holding plate 441 and the second holding plate 442 may be disposed to face each other and to be in contact with each other. In this case, the first holding plate 441 may be fixed to the first cover 110. Further, the second holding plate 442 is fixed to the first slide plate 415 to slide together with the first slide plate 415. That is, when the display panel 160 is folded, the second holding plate 442 may slide together with the first slide plate 415. In this case, the second holding plate 442 may move along the pair of first slide rails 412 together with the first slide plate 415, but the present disclosure is not limited thereto.

The first holding plate 441 and the second holding plate 442 may be formed of a magnetic substance. In this case, the first holding plate 441 and the second holding plate 442 includes a plurality of negative poles 441*a* and 442*a* and a plurality of positive poles 441*b* and 442*b*. The plurality of negative poles 441*a* and 442*a* and the plurality of positive poles 441*b* and 442*b* may be alternately disposed along a specific interval. The plurality of negative poles 441*a* and 442*a* and the plurality of positive poles 441*b* and 442*b* of the first holding plate 441 and the second holding plate 442 may be alternately disposed along a first direction perpendicular to the boundary line of the first cover 110 and the second cover 120.

The first holding plate 441 including the plurality of negative poles 441*a* and the plurality of positive poles 441*b* and the second holding plate 442 including the plurality of negative poles 442*a* and the plurality of positive poles 442*b* are disposed to face each other so that magnetic force may be generated between the first holding plate 441 and the second holding plate 442. That is, the first holding plate 441 and the second holding plate 442 are disposed such that the plurality of negative poles 441*a* and 442 and the plurality of positive poles 441*b* and 442*b* face each other on a contact surface. Therefore, the first holding unit 440 may implement the holding force of the foldable display device 400 by the magnetic force between the first holding plate 441 and the second holding plate 442.

Specifically, when the user applies force to fold the foldable display device 400, the first cover 110 and the second cover 120 move to have a specific folding angle. In this case, the display panel 160 is also folded so that one side of the display panel 160 slides together with the first slide plate 415 and the second holding plate 442. Therefore, the plurality of negative poles 442a and the plurality of positive poles 442b of the second holding plate 442 may be disposed to alternately face the plurality of negative poles 441a and the plurality of positive poles 441b of the fixed first holding plate 441. Therefore, the first holding unit 440 may have a structure in which an attractive force or a repulsive force is repeated according to a specific angle formed by the first cover 110 and the second cover 120.

In this case, as illustrated in FIG. 10A, when the first holding plate 441 and the second holding plate 442 are disposed such that different polarities face each other, an attractive force may be generated. That is, when the plurality of negative poles 441a of the first holding plate 441 and the plurality of positive poles 442b of the second holding plate 442 are disposed to face each other or the plurality of positive poles 441b of the first holding plate 441 and the plurality of negative poles 442a of the second holding plate 442 are disposed to face each other, the attractive force may be generated between the first holding plate 441 and the second holding plate 442.

In contrast, as illustrated in FIG. 10B, when the first holding plate 441 and the second holding plate 442 are disposed such that same polarities face each other, a repulsive force may be generated. That is, when the plurality of negative poles 441a of the first holding plate 441 and the plurality of negative poles 442a of the second holding plate 442 are disposed to face each other or the plurality of positive poles 441b of the first holding plate 441 and the plurality of positive poles 442b of the second holding plate 442 are disposed to face each other, the repulsive force may be generated between the first holding plate 441 and the second holding plate 442.

In the meantime, the external force which is applied to the foldable display device 400 by the user may be larger than the attractive force and the repulsive force between the first holding plate 441 and the second holding plate 442. Therefore, even though the attractive force and the repulsive force are generated between the first holding plate 441 and the second holding plate 442, the user may fold or unfold the foldable display device 400 at a desired angle.

However, when the repulsive force is generated between the first holding plate 441 and the second holding plate 442, the user may more easily perform the folding operation of the foldable display device 400 by a pushing force between magnets. That is, the repulsive force is generated in the first holding unit 440, the first holding plate 441 and the second holding plate 442 may be minutely spaced apart from each other by the repulsive force. In this case, the friction between the first holding plate 441 and the second holding plate 442 may be minimized. In other words, when the repulsive force is generated in the first holding unit 440, the friction between the first holding plate 441 and the second holding plate 442 may be minimized as compared with the case that the attractive force is generated in the first holding unit 440.

The first holding plate 441 and the second holding plate 442 include the plurality of negative poles 441a and 442a and the plurality of positive poles 441b and 442b along a specific interval, so that a plurality of friction minimizing sections in which the friction is minimized may be provided. That is, the first holding plate 441 and the second holding plate 442 are disposed along a specific interval such that the same polarities face each other so that the friction between the first holding plate 441 and the second holding plate 442 may be minimized. In the friction minimizing section, the user may more easily perform the folding or unfolding operation of the foldable display device 400.

In contrast, when the first holding plate 441 and the second holding plate 442 are disposed along a specific interval such that the different polarities face each other, the friction between the first holding plate 441 and the second holding plate 442 may be increased. That is, when the attractive force is generated in the first holding unit 440, the attractive force and the frictional force between the first holding plate 441 and the second holding plate 442 may be minimized as compared with the case that the repulsive force is generated in the holding unit. The holding force of the foldable display device 400 may be most strongly maintained in this section.

When the external force which is applied to the foldable display device 400 at a specific folding angle is removed, the foldable display device 400 may maintain the specific folding angle by a magnetic force between the first holding plate 441 and the second holding plate 442.

That is, when the attractive force is generated in the first holding plate 441 and the second holding plate 442, the first holding plate 441 and the second holding plate 442 are fixed to generate the holding force. In other words, the first holding plate 441 and the second holding plate 442 are fixed so that motions of the first cover 110, the first slide plate 415, and the display panel 160 fixed to the first holding plate 441 and the second holding plate 442 stop and thus the holding force may be generated. In contrast, when the repulsive force is generated in the first holding plate 441 and the second holding plate 442, the first holding plate 441 and the second holding plate 442 may slide to generate the attractive force. As a result, the second holding plate 442 slides to be fixed to the first holding plate 441 so that the holding force may be generated thereby.

Specifically, when the first holding plate 441 and the second holding plate 442 are disposed such that different polarities face each other, the first holding plate 441 and the second holding plate 442 may be fixed to each other by the attractive force. In this case, since the first holding plate 441 is fixed to the first cover 110, the movement of the first cover 110 may be suppressed by the attractive force of the first holding plate 441 and the second holding plate 442. Further, since the second holding plate 442 is fixed to the first slide plate 451 which is fixed to one side of the display panel 160, the sliding of the first slide plate 451 and the one side of the display panel 160 may be suppressed by the attractive force of the first holding plate 441 and the second holding plate 442.

That is, the first holding plate 441 and the second holding plate 442 are fixed to each other, so that all the motions of the first cover 110, the first slide plate 451, and the display panel 160 connected thereto may stop. Therefore, the foldable display device 400 may maintain a specific folding angle.

In contrast, when the first holding plate 441 and the second holding plate 442 are disposed such that same polarities face each other, the first holding plate 441 and the second holding plate 442 may push each other by the repulsive force. Further, magnets have property that different polarities attract each other, so that the second holding plate 442 may slide to generate the attractive force with the first holding plate 441. In this case, the first holding plate 441 and the second holding plate 442 have a pattern in which the plurality of negative poles 441a and 442a and the plurality of positive poles 441b and 442b are alternately disposed, so that the attractive force may be generated between the first holding plate 441 and the second holding plate 442 only by a minute sliding operation of the second holding plate 442. As a result, the attractive force works between the first holding plate 441 and the second holding plate 442 so that the foldable display device 400 may maintain a specific folding angle.

In the meantime, since the first holding plate 441 and the second holding plate 442 include the plurality of negative poles 441a and 442a and the plurality of positive poles 441b and 442b, the foldable display device 400 may have various folding angles. That is, the first cover 110 and the second cover 120 may be fixed at angles corresponding to the plurality of negative poles 441a and 442a and the plurality of positive poles 441b and 442b. Therefore, the folding angle of the foldable display device 400 may be controlled by adjusting the number of the plurality of negative poles 441a and 442a and the plurality of positive poles 441b and 442b of the first holding plate 441 and the second holding plate 442 and intervals therebetween.

Further, the strength of the holding force of the foldable display device 400 may be controlled by adjusting the strength of the magnetic force of the permanent magnet applied to the first holding plate 441 and the second holding plate 442.

The second holding unit 450 includes the first holding plate 451 and the second holding plate 452. The first holding plate 451 and the second holding plate 452 may be disposed to face each other and to be in contact with each other. In this case, the first holding plate 451 may be fixed to the second cover 120. Further, the second holding plate 452 is fixed to the second slide plate 425 to slide together with the second slide plate 425. That is, when the display panel 160 slides, the second holding plate 452 may slide together with the second slide plate 425.

The first holding plate 451 and the second holding plate 452 may have the same structure as the first holding plate 441 and the second holding plate 442 of the first holding unit 440. That is, the first holding plate 451 and the second holding plate 452 may include a plurality of negative poles and a plurality of positive poles which are alternately disposed along the first direction. Therefore, the holding force of the foldable display device 400 may be implemented by the magnetic force of the first holding plate 451 and the second holding plate 452.

In the meantime, the second holding unit 450 may be omitted together with the second slide plate 425. In this case, the other side of the display panel 160 is fixed to the second cover 120 so as not to move and only one side of the display panel 160 may slide. Further, the second slide plate 425 and the second holding unit 450 are provided and the first slide plate 415 and the first holding unit 440 may be omitted.

The display panel 160 is disposed on the first cover 110 and the second cover 120. Specifically, one side and the other side of the display panel 160 are fixed to the first slide plate 415 and the second slide plate 425 to slide together with the first slide plate 415 and the second slide plate 425. However, the present disclosure is not limited thereto. That is, only one of the one side and the other side of the display panel 160 slides and the other one may be fixed.

The display panel 160 may use any one of various display panels such as an organic light emitting display panel or a liquid crystal display panel. Further, the display panel 160 may have flexibility so as to be folded in accordance with the folding of the foldable display device 400.

A general foldable display device implements a holding force for maintaining a specific folding angle of the foldable display device through a hinge. That is, the holding force is implemented by the frictional force between hinge components. However, the hinge components are worn out due to the frictional force caused by the consistent folding and unfolding operation, so that the holding force is decreased and the durability of the hinge and the foldable display device is lowered.

Therefore, the foldable display device 400 according to another exemplary embodiment of the present disclosure disposes the first holding unit 440 between the first cover 110 and the first slide plate 415 to implement the holding force through the first holding unit 440. In this case, the first holding unit 440 includes a first holding plate 441 fixed to the first cover 110 and a second holding plate 442 which is fixed to the first slide plate 415 and one side of the display panel 160 to slide. Further, the first holding plate 441 and the second holding plate 442 include a plurality of negative poles 441a and 442a and a plurality of positive poles 441b and 442b, respectively.

The first holding unit 440 may implement the holding force using a magnetic force between the first holding plate 441 and the second holding plate 442. Specifically, when the first holding plate 441 and the second holding plate 442 are disposed such that different polarities face each other to generate the attractive force therebetween, one side of the first cover 110, the first slide plate 415, and the display panel 160 which are fixed thereto by the attractive force may be fixed. Therefore, the foldable display device 400 may maintain a specific folding angle.

Further, the foldable display device 400 according to another exemplary embodiment of the present disclosure may implement the permanent holding force by the magnetic force between the permanent magnets. That is, even though the first holding plate 441 and the second holding plate 442 are in contact with each other to be worn out, the magnetic force may be consistently maintained. Therefore, the holding force of the first holding unit 440 may be permanently maintained. As a result, the decrease of the holding force is reduced so that the durability of the foldable display device 400 may be improved.

Further, the foldable display device 400 according to another exemplary embodiment of the present disclosure implements the holding force through the first holding unit 440 applied to the first slide plate 415, rather than through the hinge 130. Accordingly, the structure of the hinge 130 may be simplified as compared with the foregoing exemplary embodiments so that the manufacturing process of the foldable display device 400 is simplified and the manufacturing cost may be saved.

Hereinafter, the first holding unit according to various exemplary embodiments of the present disclosure will be described with reference to FIGS. 11 and 12.

Figure 11:
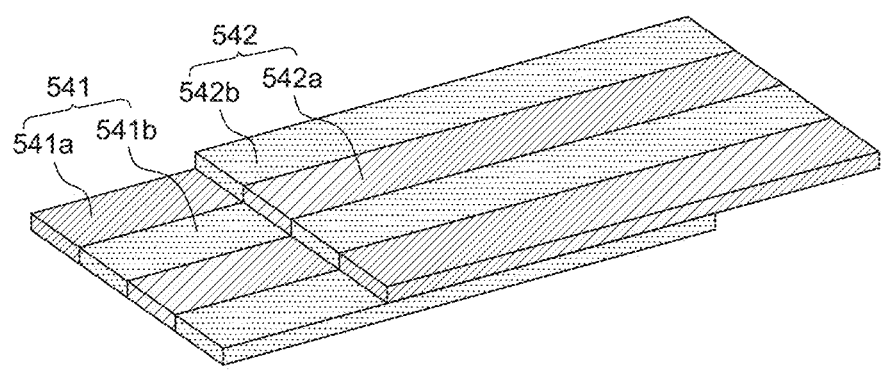
FIG. 11 is a perspective view illustrating a first holding unit according to yet another exemplary embodiment of the present disclosure.

FIG. 11 is a perspective view illustrating a first holding unit according to yet another exemplary embodiment of the present disclosure.

Referring to FIG. 11, the first holding unit 540 includes a first holding plate 541 and a second holding plate 542. The first holding plate 541 and the second holding plate 542 may be disposed to face each other and to be in contact with each other. In this case, the first holding plate 541 may be fixed to the first cover 110. Further, the second holding plate 542 is fixed to the first slide plate 415 to slide together with the first slide plate 415. That is, when the display panel 160 is folded, the second holding plate 542 may slide together with the first slide plate 415.

The first holding plate 541 and the second holding plate 542 include a plurality of negative poles 541a and 542a and a plurality of positive poles 541b and 542b. In this case, the plurality of negative poles 541a and 542a and the plurality of positive poles 541b and 542b of the first holding plate 541 and the second holding plate 542 may be alternately disposed such that the boundary lines of the plurality of negative poles 541a and 542a and the plurality of positive poles 541b and 542b are parallel to the first direction.

A magnetic force may be generated between the first holding plate 541 including the plurality of negative poles 541a and the plurality of positive poles 541b and the second holding plate 542 including the plurality of negative poles 542a and the plurality of positive poles 542b. That is, the first holding plate 541 and the second holding plate 542 are disposed such that the plurality of negative poles 541a and 542a and the plurality of positive poles 541b and 542b face each other on a contact surface. Specifically, the first holding plate 541 and the second holding plate 542 may be disposed such that different polarities face each other. Therefore, the first holding unit 540 may implement the holding force of the foldable display device 400 by the attractive force between the first holding plate 541 and the second holding plate 542.

In the meantime, the external force which is applied to the foldable display device 400 by the user may be larger than the attractive force between the first holding plate 541 and the second holding plate 542. Therefore, the user may fold the foldable display device 400 at a desired angle.

When the external force which is applied to the foldable display device 400 at a specific folding angle is removed, the foldable display device 400 may maintain the specific folding angle by the attractive force between the first holding plate 541 and the second holding plate 542. That is, the first holding plate 541 and the second holding plate 542 are fixed by the attractive force and motions of the first cover 110, the first slide plate 415, and the display panel 160 fixed to the first holding plate 541 and the second holding plate 542 stop so that the holding force may be generated. Therefore, the foldable display device 400 may maintain a specific folding angle.

As compared with the first holding unit 440 of the foregoing exemplary embodiment, the first holding unit 540 according to another exemplary embodiment of the present disclosure may implement the holding force of the foldable display device 400 only by the attractive force. Therefore, as compared with the case that the attractive force and the repulsive force alternately work in accordance with the sliding of the first slide plate 415, a precision of the operation of the first holding unit 540 may be improved.

Further, the first holding unit 540 according to another exemplary embodiment of the present disclosure reduces the number of the plurality of negative poles 541a and 542a and the plurality of positive poles 541b and 542b, so that the manufacturing process is simple and the manufacturing cost may be saved. That is, in the case of the first holding unit 440 illustrated in FIGS. 8 to 10B, the plurality of negative poles 441a and 442a and the plurality of positive poles 441b and 442b are alternately disposed along the first direction so that the attractive force and the repulsive force may be alternately generated when the foldable display device 400 is folded. Therefore, in order to provide various folding angles of the foldable display device 400, the first holding unit 440 needs to increase the number of the plurality of negative poles 441a and 442a and the plurality of positive poles 441b and 442b.

However, since only the attractive force works in the first holding unit 540 according to another exemplary embodiment of the present disclosure, the holding force may be implemented at all angles regardless of the number of plurality of negative poles 541a and 542a and the plurality of positive poles 541b and 542b.

Figure 12:
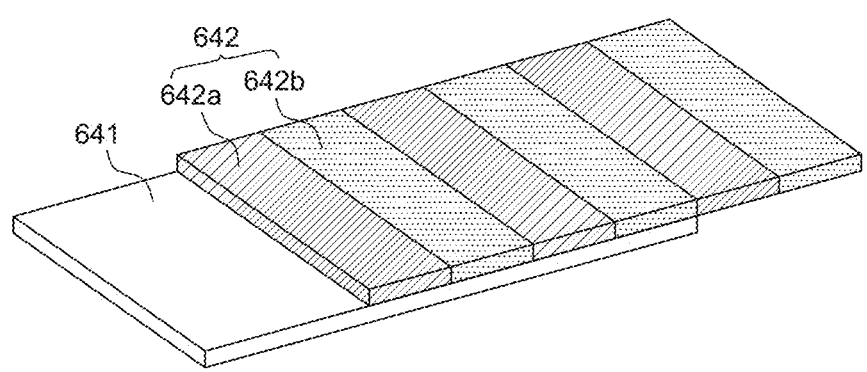
FIG. 12 is a perspective view illustrating a first holding unit according to yet another exemplary embodiment of the present disclosure.

FIG. 12 is a perspective view illustrating a first holding unit according to yet another exemplary embodiment of the present disclosure.

Referring to FIG. 12, a first holding unit 640 includes a first holding plate 641 and a second holding plate 642. The first holding plate 641 and the second holding plate 642 may be disposed to face each other and to be in contact with each other. In this case, the first holding plate 641 may be fixed to the first cover 110. Further, the second holding plate 642 is fixed to the first slide plate 415 to slide together with the first slide plate 415. That is, when the display panel 160 is folded, the second holding plate 642 may slide together with the first slide plate 415.

The first holding plate 641 is formed of a metallic material. The second holding plate 642 is formed of a magnet to include a plurality of negative poles 642a and a plurality of positive poles 642b. In this case, the plurality of negative poles 642a and the plurality of positive poles 642b of the second holding plate 642 may be alternately disposed along the first direction. That is, the second holding plate 642 may be formed to be the same as the second holding plate 442 illustrated in FIGS. 10A and 10B.

In the meantime, even though in FIG. 12, the second holding plate 642 is formed to be the same as the second holding plate 442 illustrated in FIGS. 10A and 10B, the second holding plate 642 may be formed to be the same as the second holding plate 542 illustrated in FIG. 11. That is, the plurality of negative poles 642a and the plurality of positive poles 642b of the second holding plate 642 may be alternately disposed such that the boundary line is parallel to the first direction.

Further, in FIG. 12, the first holding plate 641 is formed of a metallic material and the second holding plate 642 is formed of a magnet, but the opposite case is also possible. That is, the first holding plate 641 is formed of a magnet and the second holding plate 642 is formed of a metallic material.

The first holding plate 641 is formed of a metal and the second holding plate 642 is formed of a magnet, so that the magnetic force may be generated between the first holding plate 641 and the second holding plate 642. Specifically, the attractive force is generated between the first holding plate 642 and the second holding plate 642 so that the first holding unit 640 may implement the holding force of the foldable display device 400 by the attractive force.

In the meantime, the external force which is applied to the foldable display device 400 by the user may be larger than the attractive force between the first holding plate 641 and the second holding plate 642. Therefore, the user may fold the foldable display device 400 at a desired angle.

When the external force which is applied to the foldable display device 400 at a specific folding angle is removed, the foldable display device 400 may maintain the specific folding angle by an attractive force between the first holding plate 641 and the second holding plate 642. That is, the first holding plate 641 and the second holding plate 642 are fixed by the attractive force and motions of the first cover 110, the first slide plate 415, and the display panel 160 fixed to the first holding plate 641 and the second holding plate 642 stop so that the holding force may be generated. Therefore, the foldable display device 400 may maintain a specific folding angle.

In the first holding unit 640 according to another exemplary embodiment of the present disclosure, one of the first holding plate 641 and the second holding plate 642 is formed of a metallic material and the other one is formed of a magnet, so that the holding force may be implemented through the first holding unit 640 with a simpler structure. That is, the first holding unit 440 and 540 of the foregoing exemplary embodiments is configured by two magnets and each magnet includes a plurality of negative poles and a plurality of positive poles, but the first holding unit 640 according to another exemplary embodiment of the present disclosure includes only one magnet so that the first holding unit 640 may be more simply formed.

Further, in the first holding unit 640 according to another exemplary embodiment of the present disclosure, similarly to the holding unit 540 of FIG. 11 which has been described above, the number of the plurality of negative poles 642*a* and the plurality of positive poles 642*b* may be reduced. That is, only the attractive force works in the first holding unit 640 so that the holding force may be implemented at all angles.

Hereinafter, an in-folding operation and an out-folding operation of a foldable display device according to still another exemplary embodiment of the present disclosure will be described with reference to FIGS. 13A to 14B.

In the meantime, for the convenience of description, in FIGS. 13A to 14B, the first slide plate 415 and the first holding unit 440 are disposed in the first cover 110 of the foldable display device 400 and the second slide plate 425 and the second holding unit 450 in the second cover 120 are omitted. However, the present disclosure is not limited thereto.

Figure 13A:
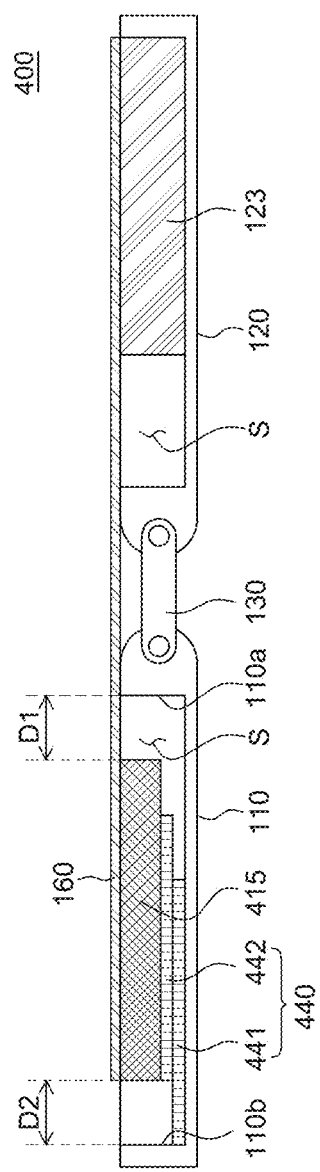
FIGS. 13A to 13C are schematic cross-sectional views for explaining an in-folding operation of a foldable display device according to yet another exemplary embodiment of the present disclosure.
Figure 13B:
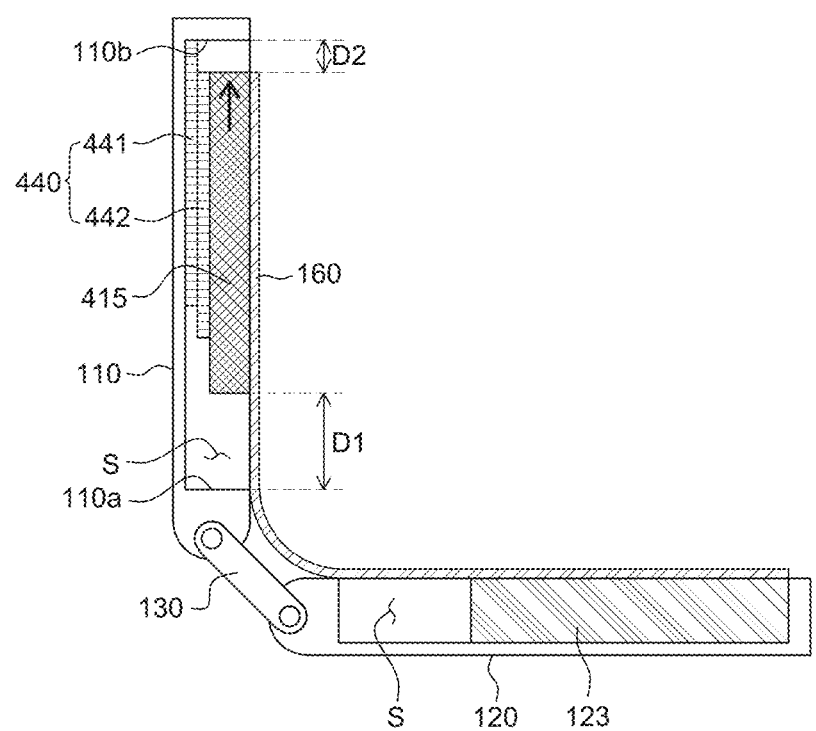
Figure 13C:
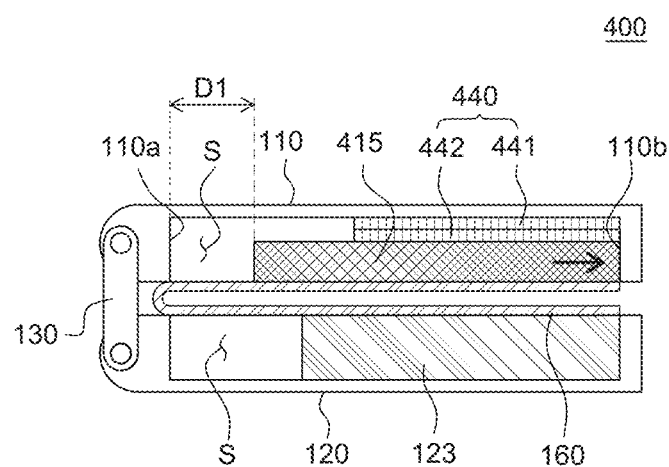

FIGS. 13A to 13C are schematic cross-sectional views for explaining an in-folding operation of a foldable display device according to yet another exemplary embodiment of the present disclosure.

The foldable display device 400 may be in-folded so that the display panel 160 is disposed therein. At the time of in-folding, the foldable display device 400 may be folded such that one side and the other side of the display panel 160 face each other.

Referring to FIG. 13A, the foldable display device 400 may be fully extended while the first cover 110 and the second cover 120 form approximately 180°. In this case, the display panel 160 disposed on the first cover 110 and the second cover 120 may be fully extended. Hereinafter, for the convenience of description, two cases of the in-folding and out-folding will be described while defining the foldable display device 400 of FIG. 13A as an initial state.

When the foldable display device 400 is fully extended, the first slide plate 415 disposed in the accommodating unit S of the first cover 110 may be spaced apart from the first inner surface 110*a* and a second inner surface 110*b* of the first cover 110. In this case, a distance spaced between the first slide plate 415 and the first inner surface 110*a* is defined as a first separation distance D1 and a distance spaced between the first slide plate 415 and the second inner surface 110*b* is defined as a second separation distance D2.

In the meantime, the first inner surface 110*a* and the second inner surface 110*b* may refer to surfaces which are parallel to the boundary line of the first cover 110 and the second cover 120, among inner surfaces which configure the accommodating unit S. Further, the first inner surface 110*a* may be adjacent to the boundary line of the first cover 110 and the second cover 120 and the second inner surface 110*b* may be spaced apart from the first inner surface 110*a* to face the first inner surface 110*a*.

One side of the display panel 160 is fixed to the first slide plate 415 and the other side may be fixed to the second cover 120. In this case, the one side of the display panel 160 may slide by the sliding of the first slide plate 415. Further, the other side of the display panel 160 is fixed to the second cover 120 so as not to slide. For example, the other side of the display panel 160 may be fixed to the second cover 120 by a component such as a fixing member 123 disposed in the accommodating unit S of the second cover 120, but is not limited thereto.

Referring to FIG. 13B, the foldable display device 400 may be in-folded by an external force to form approximately 90° by the first cover 110 and the second cover 120. In this case, the display panel 160 disposed on the first cover 110 and the second cover 120 may also be in-folded by the movement of the first cover 110 and the second cover 120. Further, the display panel 160 may be in-folded while bending the central portion corresponding to the boundary area of the first cover 110 and the second cover 120 in which the hinge 130 is disposed.

When the foldable display device 400 is in-folded, the first sliding plate 415 may slide in a direction which is far away from the boundary line of the first cover 110 and the second cover 120. In this case, the direction which is far away from the boundary line of the first cover 110 and the second cover 120 may be a direction directed to the second inner surface 110*b*.

Specifically, the display panel 160 is curved inside the first cover 110 and the second cover 120, so that one end of the display panel 160 may be pushed toward the second inner surface 110*b* as compared with the initial state. That is, the central portion of the display panel 160 forms a curved surface in the first cover 110 and the second cover 120 so that as illustrated by an arrow in FIG. 13B, one side of the display panel 160 and the first slide plate 415 may slide toward the second inner surface 110*b*. Therefore, the first separation distance D1 may be increased and the second separation distance D2 may be decreased.

When the external force is removed, the foldable display device 400 may be fixed while maintaining an in-folded angle by the holding force provided by the first holding unit 440. Specifically, the first holding unit 440 includes the first holding plate 441 and the second holding plate 442 including a plurality of negative poles 441*a* and 442*a* and a plurality of positive poles 441*b* and 442*b*. In this case, the second holding plate 442 is fixed to the first slide plate 415 to slide together with the first slide plate 415. Therefore, the first holding plate 441 and the second holding plate 442 may be disposed such that different polarities face each other to generate the attractive force. That is, the folding angle of the foldable display device 400 may be maintained by the attractive force between the first holding plate 441 and the second holding plate 442.

Referring to FIG. 13C, the foldable display device 400 may be in-folded by an external force so that the first cover 110 and the second cover 120 completely face each other. In this case, the first cover 110 and the second cover 120 may be disposed to completely face each other with the display panel 160 therebetween. Further, the display panel 160 disposed on the first cover 110 and the second cover 120 may also be in-folded by the movement of the first cover 110 and the second cover 120 so that one side and the other side of the display panel 160 face each other. Moreover, the display panel 160 may be in-folded while bending the central portion to form a curved surface.

The central portion of the display panel 160 forms a curved surface in the first cover 110 and the second cover 120 so that as illustrated by an arrow in FIG. 13C, one side of the display panel 160 and the first slide plate 415 may slide toward the second inner surface 110*b*. Further, in FIG.

13C, the in-folding operation of the foldable display device 400 is larger than that of FIG. 13B, so that the first separation distance D1 may be further increased and the second separation distance D2 may be further decreased.

Specifically, an in-folding operation of the foldable display device 400 illustrated in FIG. 13C is larger than an in-folding operation of the foldable display device 400 illustrated in FIG. 13B. As the in-folding operation of the foldable display device 400 is increased, the first slide plate 415 may be closer to the second inner surface 110b. That is, as the in-folding operation of the foldable display device 400 is increased, the first separation distance D1 may be increased and the second separation distance D2 may be decreased.

As illustrated in FIG. 13C, when the foldable display device 400 is fully in-folded, the first slide plate 415 may be in contact with the second inner surface 110b. However, the present disclosure is not limited thereto. Even though the foldable display device is fully in-folded in accordance with the design of the foldable display device 400, the first slide plate 415 and the second inner surface 110b may be spaced apart from each other.

Further, when the external force is removed, the foldable display device 400 may be fixed while maintaining an in-folded angle by the holding force provided by the first holding unit 440.

Figure 14A:
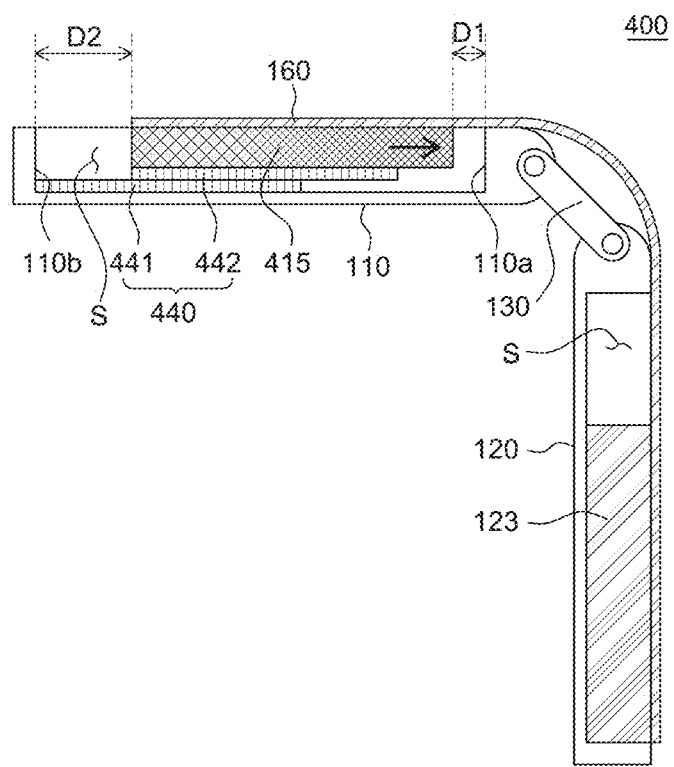
FIGS. 14A and 14B are schematic cross-sectional views for explaining an out-folding operation of a foldable display device according to yet another exemplary embodiment of the present disclosure.
Figure 14B:
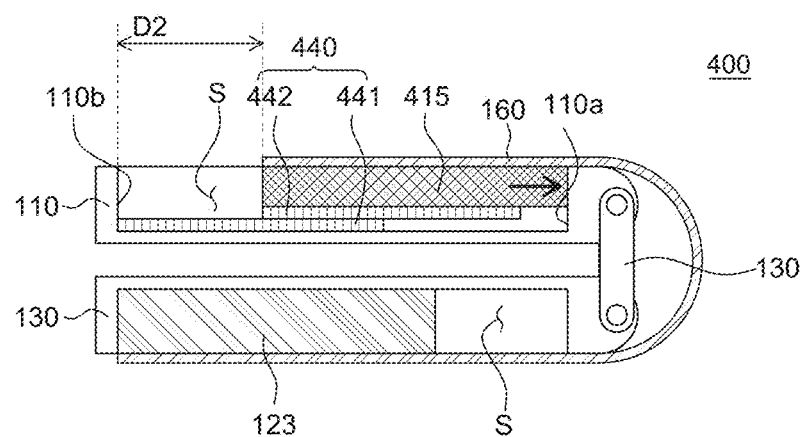

FIGS. 14A and 14B are schematic cross-sectional views for explaining an out-folding operation of a foldable display device according to yet another exemplary embodiment of the present disclosure.

The foldable display device 400 may be out-folded so that the display panel 160 is disposed thereoutside. That is, when the foldable display device is out-folded, the foldable display device 400 may be folded such that the first cover 110 and the second cover 120 face each other. In the meantime, the foldable display device 400 which has not been out-folded may have the same initial state as illustrated in FIG. 13A.

Referring to FIG. 14A, the foldable display device 400 may be out-folded by an external force to form approximately 90° by the first cover 110 and the second cover 120. In this case, the display panel 160 disposed on the first cover 110 and the second cover 120 may also be out-folded by the movement of the first cover 110 and the second cover 120. Moreover, the display panel 160 may be out-folded while the central portion is bent to form a curved surface.

When the foldable display device 400 is out-folded, the first sliding plate 415 may slide in a direction which is closer to the boundary line of the first cover 110 and the second cover 120. In this case, the direction which is closer to the boundary line of the first cover 110 and the second cover 120 may be a direction directed to the first inner surface 110a.

Specifically, the display panel 160 is curved outside the first cover 110 and the second cover 120, so that one end of the display panel 160 may be pulled toward the first inner surface 110a as compared with the initial state. That is, the central portion of the display panel 160 forms a curved surface outside the first cover 110 and the second cover 120 so that as illustrated by an arrow in FIG. 14A, one side of the display panel 160 and the first slide plate 415 may slide toward the first inner surface 110a. Therefore, the first separation distance D1 may be decreased and the second separation distance D2 may be increased.

When the external force is removed, the foldable display device 400 may be fixed while maintaining an out-folded angle by the holding force provided by the first holding unit 440.

Referring to FIG. 14B, the foldable display device 400 may be out-folded by an external force so that the first cover 110 and the second cover 120 completely face each other. In this case, the display panel 160 disposed on the first cover 110 and the second cover 120 may also be out-folded by the movement of the first cover 110 and the second cover 120 such that one side and the other side of the display panel 160 face each other. Further, one side and the other side of the display panel 160 may be out-folded to face each other with the first cover 110 and the second cover 120 therebetween. Moreover, the display panel 160 may be out-folded while the central portion is bent to form a curved surface.

That is, the central portion of the display panel 160 forms a curved surface outside the first cover 110 and the second cover 120 so that as illustrated by an arrow in FIG. 14B, one side of the display panel 160 and the first slide plate 415 may slide toward the first inner surface 110a. Further, in FIG. 14B, the out-folding operation of the foldable display device 400 is larger than that of FIG. 14A, so that the first separation distance D1 may be further decreased and the second separation distance D2 may be further increased.

Specifically, an out-folding operation of the foldable display device 400 illustrated in FIG. 14B is larger than an out-folding operation of the foldable display device 400 illustrated in FIG. 14A. As the out-folding operation of the foldable display device 400 is increased, the first slide plate 415 may be closer to the first inner surface 110a. That is, as the out-folding operation of the foldable display device 400 is increased, the first separation distance D1 may be decreased and the second separation distance D2 may be increased.

As illustrated in FIG. 14B, when the foldable display device 400 is fully out-folded, the first slide plate 415 may be in contact with the first inner surface 110a. However, the present disclosure is not limited thereto. Even though the foldable display device is fully out-folded in accordance with the design of the foldable display device 400, the first slide plate 415 and the first inner surface 110a may be spaced apart from each other.

Further, when the external force is removed, the foldable display device 400 may be fixed while maintaining an out-folded angle by the holding force provided by the first holding unit 440.

As illustrated in FIGS. 13A and 14B, in the foldable display device 400, the first slide plate 415 and the first holding unit 440 are disposed in the first cover 110, but the second slide plate 425 and the second holding unit 450 may be omitted. Alternatively, the second slide plate 425 and the second holding unit 450 are disposed in the second cover 120 and the first slide plate 415 and the first holding unit 440 may be omitted.

In this case, only one of one side and the other side of the display panel 160 slides and the other one is fixed so that the display panel 160 may be more stably folded.

Furthermore, on both the first cover 110 and the second cover, the first slide plate 415 and the first holding unit 440 and the second slide plate 425 and the second holding unit 450 may be disposed. In this case, one side and the other side of the display panel 160 may slide together with the first slide plate 415 and the second slide plate 425.

When both one side and the other side of the display panel 160 are slidable, the one side and the other side corresponding to the first cover 110 and the second cover 120 of the foldable display device 400 may be balanced. Specifically, positions of one end and the other end of the display panel 160 may be symmetrical.

When only one side of the display panel 160 is slidable, the first separation distance D1 or the second separation distance D2 which is an interval for sliding is necessary for the first cover 110 on which the first slide plate 415. Therefore, as illustrated in FIG. 13A, one end of the display panel 160 is disposed to be spaced apart from the end of the first cover 110 and the other end is disposed to be adjacent to the end of the second cover 110. Further, as illustrated in FIG. 14B, when the foldable display device 400 is fully out-folded, one end and the other end of the display panel 160 may not be disposed on the same line.

However, when both one side and the other side of the display panel 160 are slidable, the one end and the other end of the display panel 160 may be disposed to be symmetrical.

As described above, the foldable display device 400 may be configured to be in-folded and out-folded. That is, in the initial state of the foldable display device 400, the first slide plate 415 may be spaced apart from the first inner surface 110a and the second inner surface 110b with the first separation distance D1 and the second separation distance D2. Therefore, at the time of in-folding, the first slide plate 415 may slide toward the second inner surface 110b so that the second separation distance D2 is decreased. Further, at the time of out-folding, the first slide plate 415 may slide toward the first inner surface 110a so that the first separation distance D1 is decreased.

Since the foldable display device 400 is configured to be in-folded and out-folded, various folding operations may be performed so that convenience of the user may be increased.

In the meantime, the foldable display device 400 may be configured to perform only the in-folding operation. In this case, the foldable display device 400 may be configured such that the first separation distance D1 for out-folding may be omitted in an initial state. That is, in the initial state, the first slide plate 415 may be in contact with the first inner surface 110a.

Further, the foldable display device 400 may be configured to perform only the out-folding operation. In this case, the foldable display device 400 may be configured such that the second separation distance D2 for in-folding may be omitted in an initial state. That is, in the initial state, the first slide plate 415 may be in contact with the second inner surface 110b.

When the foldable display device 400 is configured to perform any one of in-folding operation and the out-folding operation, the first separation distance D1 or the second separation distance D2 is omitted so that the size of the foldable display device 400 may be reduced.

The exemplary embodiments of the present disclosure can also be described as follows:

According to an aspect of the present disclosure, a foldable display device includes a display panel disposed on a first cover and a second cover; and at least one hinge which connects the first cover and the second cove and the hinge includes a fixing frame, a pair of hinge shafts which passes through the fixing frame; a pair of rotating plates which is fixed to one end of the pair of hinge shafts and fixed to the first cover and the second cover to rotate together with the first cover and the second cover; and a pair of first holding members which is coupled to the pair of hinge shafts between the fixing frame and the pair of rotating plates and controls a folding angle of the first cover and the second cover by a magnetic force.

According to another aspect of the present disclosure, the pair of first holding members may rotate together with the pair of rotating plates.

According to another aspect of the present disclosure, the foldable display device may further include a pair of second holding members which is fixed to the fixing frame and is fixed to the pair of hinge shafts between the fixing frame and the pair of first holding members.

According to another aspect of the present disclosure, each of the pair of first holding members and each of the pair of second holding members may include a plurality of negative poles and a plurality of positive poles and the plurality of negative poles and the plurality of positive poles may be alternately disposed along a direction perpendicular to the hinge shaft.

According to another aspect of the present disclosure, when the pair of first holding members and the pair of second holding members are disposed such that different polarities face each other by the rotation of the pair of first holding members, the pair of rotating plates may be fixed.

According to another aspect of the present disclosure, the pair of rotating plates may be fixed by an attractive force between the pair of first holding members and the fixing frame.

According to another aspect of the present disclosure, the foldable display device may further include a fixing plate which is spaced apart from the fixing frame to be fixed to the other end of the pair of hinge shafts; and a pair of springs which is coupled to the pair of hinge shafts between the fixing plate and the fixing frame to provide a surface friction force to the pair of first holding members by an elastic force.

According to another aspect of the present disclosure, the pair of first holding members may be fixed to the fixing frame and a pair of third holding members which is fixed to the first cover and the second cover, respectively and is disposed to be adjacent to the pair of first holding members to move together with the first cover and the second cover may be further provided.

According to another aspect of the present disclosure, the pair of first holding members may include a plurality of negative poles and a plurality of positive poles and the plurality of negative poles and the plurality of positive poles may be alternately disposed along a direction perpendicular to the hinge shaft and the pair of third holding members may include at least one of negative poles and positive poles in an area facing the pair of first holding members.

According to another aspect of the present disclosure, when the pair of first holding members and the pair of third holding members are disposed such that different polarities face each other by the movement of the pair of third holding members, the first cover and the second cover may be fixed.

According to another aspect of the present disclosure, a foldable display device includes: a first cover and a second cover coupled to the first cover; a display panel disposed on the first cover and the second cover; a first slide plate which is fixed to one side of the display panel and is disposed in the first cover to slide along a first direction perpendicular to a boundary line of the first cover and the second cover by the folding of the display panel; and a first holding unit which is disposed between the first cover and the first slide plate to control a folding angle of the first cover and the second cover by a magnetic force.

According to another aspect of the present disclosure, the first holding unit may include: a first holding plate fixed to the first cover; and a second holding plate which is fixed to the first slide plate to slide together with the first slide plate.

According to another aspect of the present disclosure, the first holding plate and the second holding plate may be disposed to be in contact with each other.

According to another aspect of the present disclosure, each of the first holding plate and the second holding plate may include a plurality of negative poles and a plurality of positive poles which are alternately disposed along the first direction, and when the first holding plate and the second holding plate are disposed such that different polarities face each other, the first cover may be fixed to form a specific folding angle with the second cover.

According to another aspect of the present disclosure, the plurality of negative poles and the plurality of positive poles of the first holding plate and the second holding plate may be alternately disposed and the boundary line of the plurality of negative poles and the positive poles may be parallel to the first direction and the first holding plate and the second holding plate may be disposed such that different polarities face each other.

According to another aspect of the present disclosure, one of the first holding plate and the second holding plate may be formed of a metallic material and the other one may be configured by a magnet.

According to another aspect of the present disclosure, the other side of the display panel may be fixed to the second cover.

According to another aspect of the present disclosure, the foldable display device may further include: a second slide plate which is fixed to the other side of the display panel and disposed in the second cover to slide along the first direction by the folding of the display panel; and a second holding unit which is disposed between the second cover and the second slide plate to control a folding angle of the first cover and the second cover by a magnetic force.

According to another aspect of the present disclosure, the second holding unit may include a first holding plate fixed to the second cover; and a second holding plate which is fixed to the second slide plate to slide together with the second slide plate.

According to another aspect of the present disclosure, when the display panel is in-folded to be disposed inside of the first cover and the second cover, the first slide plate may slide in a direction to be far away from the boundary line of the first cover and the second cover, and when the display panel is out-folded to be disposed outside of the first cover and the second cover, the first slide plate may slide in a direction to be closer to the boundary line of the first cover and the second cover.

According to a yet another aspect of the present disclosure, a frame device includes: a first supporting unit and a second supporting unit; a hinge which connects the first supporting unit and the second supporting unit; and a holding unit which includes a plurality of magnetic substances disposed in at least any one of the first supporting unit, the second supporting unit, and the hinge to allow the first supporting unit and the second supporting unit to maintain a specific angle, in which an attractive force and a repulsive force of the plurality of magnetic substances are repeated according to the specific angle formed by the first supporting unit and the second supporting unit.

According to another aspect of the present disclosure, the hinge may include a rotation center axis, the plurality of magnetic substances may be disposed in the hinge such that negative poles and positive poles are alternately disposed along a specific interval to surround the rotation center axis, and the plurality of magnetic substances may be disposed to correspond to each other.

According to another aspect of the present disclosure, at least one of the first supporting unit and the second supporting unit may further include a plate-type slide, the plurality of magnetic substances may include a first magnetic substance fixed to at least one of the first supporting unit and the second supporting unit and a second magnetic substance which is fixed to the plate-type slide to correspond to the first magnetic substance, and the negative poles and the positive poles of the first magnetic substance and the second magnetic substance may be alternately disposed along a specific interval.

According to another aspect of the present disclosure, a plurality of friction minimizing sections where the friction between the plurality of magnetic substances is minimized may be provided at the specific angle formed by the first supporting unit and the second supporting unit.

It will be apparent to those skilled in the art that various modifications and variations can be made in the foldable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display device, comprising:
   a display panel disposed on a first cover and a second cover; and
   at least one hinge that connects the first cover and the second cover,
   wherein the hinge includes:
      a fixing frame,
      a pair of hinge shafts that passes through the fixing frame,
      a pair of rotating plates that is fixed to one end of the pair of hinge shafts and fixed to the first cover and the second cover to rotate together with the first cover and the second cover,
      a pair of first holding members that are coupled to the pair of hinge shafts between the fixing frame and the pair of rotating plates and maintains a specific folding angle of the first cover and the second cover by a magnetic force,
      a fixing plate that is spaced apart from the fixing frame to be fixed to the other end of the pair of hinge shafts, and
      a pair of springs that is coupled to the pair of hinge shafts between the fixing plate and the fixing frame to provide a surface friction force to the pair of first holding members by an elastic force,
   wherein the pair of springs directly contact with the fixing plate and the fixing frame.

2. The foldable display device according to claim 1, wherein the pair of first holding members rotates together with the pair of rotating plates.

3. The foldable display device according to claim 2, further comprising a pair of second holding members that is fixed to the fixing frame and is fixed to the pair of hinge shafts between the fixing frame and the pair of first holding members.

4. The foldable display device according to claim 3, wherein:
   each of the pair of first holding members and each of the pair of second holding members includes a plurality of negative poles and a plurality of positive poles and the plurality of negative poles; and
   the plurality of positive poles are alternately disposed along a direction perpendicular to the hinge shaft.

5. A foldable display device, comprising: a display panel disposed on a first cover and a second cover; and at least one hinge that connects the first cover and the second cover, wherein the hinge includes:
- a fixing frame,
- a pair of hinge shafts that passes through the fixing frame,
- a pair of rotating plates that is fixed to one end of the pair of hinge shafts and fixed to the first cover and the second cover to rotate together with the first cover and the second cover,
- a pair of first holding members that are coupled to the pair of hinge shafts, and
- a pair of third holding members that are fixed to edges of the first cover and the second cover, respectively and move together with the first cover and the second cover,
- wherein the pair of third holding members are disposed to be adjacent to the pair of first holding members,
- wherein the pair of first holding members and the pair of third holding members maintain a specific folding angle of the first cover and the second cover by a magnetic force,
- wherein the pair of first holding members includes a plurality of negative poles and a plurality of positive poles and the plurality of negative poles and the plurality of positive poles are alternately disposed along a direction perpendicular to the hinge shaft and the pair of third holding members include at least one of negative poles and positive poles in an area facing the pair of first holding members.

6. The foldable display device according to claim 5, wherein the pair of first holding members is fixed to the fixing frame.

* * * * *